United States Patent
Yabe

(10) Patent No.: US 11,610,625 B2
(45) Date of Patent: Mar. 21, 2023

(54) HETERO-PLANE DATA STORAGE STRUCTURES FOR NON-VOLATILE MEMORY

(71) Applicant: SANDISK TECHNOLOGIES LLC, Addison, TX (US)

(72) Inventor: Hiroki Yabe, Yokohama (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/349,040

(22) Filed: Jun. 16, 2021

(65) Prior Publication Data

US 2022/0406364 A1    Dec. 22, 2022

(51) Int. Cl.
| | |
|---|---|
| *G11C 5/02* | (2006.01) |
| *G11C 11/4093* | (2006.01) |
| *G11C 11/408* | (2006.01) |
| *G11C 5/06* | (2006.01) |
| *G11C 11/4091* | (2006.01) |
| *G11C 11/4094* | (2006.01) |

(52) U.S. Cl.
CPC ............ *G11C 11/4093* (2013.01); *G11C 5/06* (2013.01); *G11C 11/4082* (2013.01); *G11C 11/4085* (2013.01); *G11C 11/4091* (2013.01); *G11C 11/4094* (2013.01)

(58) Field of Classification Search
CPC .................................................. G11C 11/4093
See application file for complete search history.

(56) References Cited

U.S. PATENT DOCUMENTS

| | | | |
|---|---|---|---|
| 7,593,263 B2 | 9/2009 | Sokolov et al. | |
| 10,651,153 B2* | 5/2020 | Fastow | .................. G11C 16/08 |
| 10,877,696 B2 | 12/2020 | Wakchaure et al. | |
| 2010/0246152 A1* | 9/2010 | Lin | ........................ H01L 23/481 |
| | | | 361/783 |

(Continued)

OTHER PUBLICATIONS

Kim et al., "A Novel NAND Flash Memory Architecture for Maximally Exploiting Plane-Level Parallelism", IEEE Transactions on Very Large Scale Integration (VLSI) Systems, vol. 27, No. 8, Aug. 2019, 5 pages.

(Continued)

*Primary Examiner* — Min Huang
(74) *Attorney, Agent, or Firm* — Morgan, Lewis & Bockius LLP

(57) ABSTRACT

A flash memory die includes (i) a first subset of planes including blocks of flash memory cells connected to a first number of word line layers and a plurality of bit lines having a first length, (ii) a second subset of planes including blocks of flash memory cells connected to a second number of word line layers less than the first number of word line layers and a plurality of bit lines having a second length shorter than the first length, (iii) first peripheral circuitry implemented underneath the first subset of planes and including first sense amplifier circuitry and first peripheral control circuitry connected to the first subset of planes, and second peripheral control circuitry connected to the second subset of planes, and (iv) second peripheral circuitry implemented underneath the second subset of planes and including second sense amplifier circuitry connected to the second subset of planes.

20 Claims, 15 Drawing Sheets

(56) References Cited

U.S. PATENT DOCUMENTS

| | | | |
|---|---|---|---|
| 2016/0027842 A1* | 1/2016 | Khalili Amiri | G11C 11/1675 |
| | | | 257/421 |
| 2017/0194039 A1* | 7/2017 | Funaki | G11C 29/028 |
| 2019/0034105 A1 | 1/2019 | Natarajan et al. | |
| 2020/0285391 A1* | 9/2020 | Sun | G06F 3/0649 |
| 2022/0115074 A1* | 4/2022 | Teoh | G11C 16/26 |

OTHER PUBLICATIONS

X NAND TM World's Fastest QLC 3D NAND Architecture; NEO Semiconductor White Paper; 2020; 16 pages.

* cited by examiner

CUA/CBA TLC/QLC Planes
600

| | | |
|---|---|---|
| ☐ Memory Array | ▨ Sense Amps (CUA) | ▨ Peripheral (CNA) |
| ▨ WL Hook-Ups | ▨ Peripheral (CUA) | ▨ Bonding Pads |

Hetero-Plane TLC/QLC and LLF
800

HETERO-PLANE DATA STORAGE STRUCTURES FOR NON-VOLATILE MEMORY

TECHNICAL FIELD

The present description relates in general to data storage systems and methods, and more particularly to hetero-plane storage structures for such data storage systems.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices.

SUMMARY

One way to increase the capacity of non-volatile memories is to add additional word line layers to the memory array, thus increasing storage capacity in a way that takes advantage of cost scalability. However, increasing the size of the memory array does not necessarily improve performance, and may in fact decrease performance.

One way to increase performance is to minimize read latency by making planes within the memory array smaller. However, smaller planes are not easily scalable in terms of cost.

By combining different types of planes into one memory die, scalability and performance can potentially be optimized. However, a straightforward combination introduces layout issues regarding the peripheral circuitry control circuitry for the high performance planes.

This disclosure describes various implementations of a hetero-plane data storage structure that combines different types of planes and their associated peripheral circuitry in a way that addresses issues regarding scalability, performance, and physical constraints.

In one aspect, a flash memory die of a data storage system includes a first subset of one or more planes, wherein each plane of the first subset includes a plurality of blocks of flash memory cells connected to (i) a first number of word line layers and (ii) a plurality of bit lines having a first length; a second subset of one or more planes, wherein each plane of the second subset includes a plurality of blocks of flash memory cells connected to (ii) a second number of word line layers less than the first number of word line layers and (ii) a plurality of bit lines having a second length shorter than the first length.

The flash memory die further includes first peripheral circuitry implemented underneath the first subset of planes and including: (i) first sense amplifier circuitry connected to the first subset of planes, (ii) first peripheral control circuitry connected to the first subset of planes; and (iii) second peripheral control circuitry connected to the second subset of planes; and second peripheral circuitry implemented underneath the second subset of planes and including second sense amplifier circuitry connected to the second subset of planes.

In some implementations, the first peripheral circuitry is arranged in a complementary metal-oxide-semiconductor (CMOS) under array (CUA) architecture under the plurality of blocks of flash memory cells of the first subset of planes; and the second peripheral circuitry is arranged in a CUA architecture under the plurality of blocks of flash memory cells of the second subset of planes.

In some implementations, the first subset of planes includes four planes arranged in two rows of two planes each; and the second subset of planes includes four planes arranged in one row.

In some implementations, the flash memory die further includes third peripheral circuitry located adjacent to the first subset of planes or the second subset of planes and including bonding pads configured to connect to an interface channel between the flash memory die and a storage controller of the data storage system.

In some implementations, the third peripheral circuitry is arranged in a CMOS next to array (CNA) architecture adjacent to the plurality of blocks of flash memory cells of the first or second subset of planes.

In some implementations, the first subset of planes is located between the second subset of planes and the third peripheral circuitry.

In some implementations, the second subset of planes is located between the first subset of planes and the third peripheral circuitry.

In some implementations, each of the first subset of planes includes a first number of blocks of flash memory cells; and each of the second subset of planes includes a second number of blocks of flash memory cells less than the first number of blocks of flash memory cells.

In some implementations, each of the first subset of planes has a first vertical height extending away from the first peripheral circuitry; and each of the second subset of planes has a second vertical height shorter than the first vertical height extending away from the second peripheral circuitry.

In some implementations, each of the first subset of planes is optimized for cost scalability; and each of the second subset of planes is optimized for read performance.

In some implementations, each of the first subset of planes includes at least 96 word line layers; and each of the second subset of planes is associated with a read latency of 3 microseconds or less.

In some implementations, the flash memory cells in each of the first subset of planes are configured to store at least three bits of data per cell; and the flash memory cells in each of the second subset of planes are configured to store one or two bits of data per cell.

In some implementations, the first peripheral control circuitry and the second peripheral control circuitry include voltage regulators, charge pumps, page buffers, timing circuits, and level shifters.

In some implementations, the first subset of planes, the second subset of planes, the first peripheral circuitry, and the second peripheral circuitry are implemented in a single wafer.

In some implementations, the first subset of planes and the second subset of planes are implemented in a first wafer; the first peripheral circuitry and the second peripheral circuitry are implemented in a second wafer; and the first wafer and the second wafer are bonded together.

In another aspect, a flash memory die of a data storage system includes: one or more triple-level-cell (TLC) or quad-level-cell (QLC) planes, wherein each of the one or more TLC or QLC planes includes a first plurality of blocks of flash memory cells; one or more low latency flash (LLF) planes, wherein each of the LLF planes includes a second plurality of blocks, fewer than the first plurality of blocks, of flash memory cells; a first CUA layer of peripheral circuitry located underneath the one or more TLC or QLC planes; and a second CUA layer of peripheral circuitry located underneath the one or more LLF planes.

The flash memory die further includes: first sense amplifier circuitry connected to the one or more TLC or QLC planes and implemented in the first CUA layer; first peripheral control circuitry connected to the one or more TLC or QLC planes and implemented in the first CUA layer; second sense amplifier circuitry connected to the one or more LLF planes and implemented in the second CUA layer; and first peripheral control circuitry connected to the one or more LLF planes and implemented in the first CUA layer.

In some implementations, the first CUA layer and the second CUA layer do not overlap.

In some implementations, at least two TLC or QLC planes of the one or more TLC or QLC planes are adjacent to at least two LLF planes of the one or more LLF planes with no CNA peripheral circuitry between the at least two TLC or QLC planes and the at least two LLF planes.

In some implementations, the flash memory die further includes a CNA layer of peripheral circuitry adjacent to the first CUA layer or the second CUA layer and including bonding pads configured to connect to an interface channel between the flash memory die and a storage controller of the data storage system.

In another aspect, a flash memory die of a data storage system includes: means for storing data in a first subset of one or more planes, wherein each plane of the first subset includes a plurality of blocks of flash memory cells connected to (i) a first number of word line layers and (ii) a plurality of bit lines having a first length; and means for storing data in a second subset of one or more planes, wherein each plane of the second subset includes a plurality of blocks of flash memory cells connected to (ii) a second number of word line layers less than the first number of word line layers and (ii) a plurality of bit lines having a second length shorter than the first length.

The flash memory die further includes: (i) means for processing stored data in first peripheral circuitry implemented underneath the first subset of planes and including: first sensing means connected to the first subset of planes; first control means connected to the first subset of planes; and second control means connected to the second subset of planes; and (ii) means for processing stored data in second peripheral circuitry implemented underneath the second subset of planes and including second sensing means connected to the second subset of planes Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
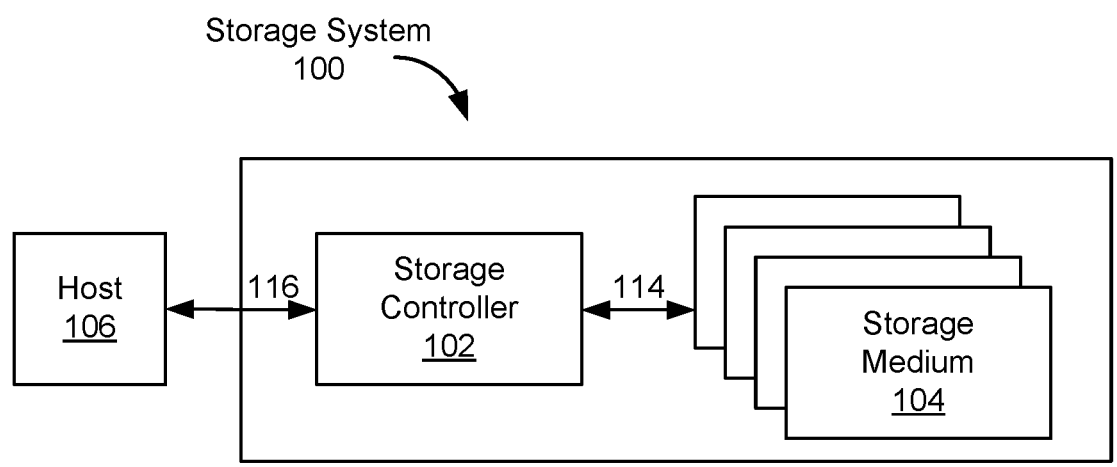
FIG. 1 is a functional block diagram of a non-volatile storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a functional block diagram of a non-volatile storage system in accordance with some implementations. Storage system 100 includes a storage controller 102 (sometimes referred to as a flash memory controller) and non-volatile memory that may be made up of one or more storage mediums 104 (sometimes referred to as memory dies). As used herein, the term storage medium (or memory die) refers to a plurality of non-volatile memory cells (e.g., one or more memory arrays), and associated circuitry (e.g., peripheral circuitry) for managing the physical operation of the non-volatile memory cells. In some implementations, the memory cells and associated circuitry are formed on a single semiconductor substrate. Storage controller 102 interfaces with a host system 106 (also referred to as a host) and transmits command sequences for read, program, and erase operations to storage medium(s) 104. Throughout this disclosure, reference may be made to a single storage medium 104. However, it should be understood that such features may additionally or alternatively be implemented across a plurality of storage mediums 104.

The storage controller 102 manages data stored on one or more storage mediums 104 (e.g., flash memory) and communicates with a host 106, such as a computer or electronic device. The storage controller 102 can have various functionality in addition to the specific functionality described herein. For example, the storage controller 102 can format the storage medium 104 to ensure the memory is operating properly, map out bad memory cells, and allocate spare memory cells to be substituted for future failed memory cells. Some part of the spare memory cells can be used to hold firmware to operate the storage controller 102 and implement other features.

In operation, when the host 106 needs to read data from or write data to a storage medium 104, the host 106 communicates with the storage controller 102. If the host 106 provides a logical address to which data is to be read/written, the storage controller 102 may convert the logical address received from the host 106 to a physical address in the storage medium 104. Alternatively, the host 106 may provide the physical address. The storage controller 102 may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The storage medium(s) 104 may include any suitable non-volatile storage medium, including NAND flash memory cells and/or NOR flash memory cells. The memory cells can take the form of solid-state (e.g., flash) memory cells and can be one-time programmable, few-time programmable, or multi-time programmable. The memory cells can also be single-level cells (SLC), multiple-level cells (MLC), triple-level cells (TLC), quad-level cells (QLC), or use other memory cell level technologies. Also, the memory cells can be fabricated in a two-dimensional or three-dimensional fashion.

The interface between the storage controller 102 and the storage medium(s) 104 may be any suitable flash interface, such as Toggle Mode or Open NAND Flash Interface (ONFI).

In some implementations, storage system 100 may be a card-based system, such as a secure digital (SD) or a micro secure digital (micro-SD) card. In some implementations, storage system 100 may be part of an embedded storage system. For example, the storage controller 102 and storage medium(s) 104 may be embedded within the host 106, such as in the form of a solid-state disk (SSD) drive installed in a computer. Such an SSD may emulate, replace, or be used instead of a hard disk drive inside the host 106, or be used as a NAS device, and so forth. In any case, such an SSD need not be made to work as a hard drive.

Although in the example illustrated in FIG. 1, storage system 100 includes a single channel between storage controller 102 and storage medium 104, the subject matter described herein is not limited to having a single memory channel. For example, in some storage system architectures, two, four, eight, or more channels may exist between the storage controller 102 and the storage medium(s) 104, depending on controller capabilities. In any of the implementations described herein, a plurality of channels may exist between the storage controller 102 and the storage medium(s) 104, even if a single channel is depicted in the drawings.

In some implementations, an intermediate storage controller (not shown) may interface the host 106 with the storage controllers 102 of a plurality of storage systems 100. The interface between the intermediate storage controller and the plurality of storage systems 100 may be a bus interface, such as a serial advanced technology attachment (SATA) or peripheral component interface express (PCIe) interface. The plurality of storage systems 100 may be implemented in a solid state drive (SSD), such as found in portable computing devices, such as laptop computers, tablet computers, or mobile devices.

In some implementations, a plurality of intermediate storage controllers (not shown) may respectively interface the host 106 with the storage controllers 102 of a plurality of storage systems 100. Such a system may be referred to as a hierarchical storage system. The host 106 may access memories within the storage systems 100 via a bus interface. In some implementations, the bus interface may be an NVMe or fiber channel over Ethernet (FCoE) interface. In some implementations, a hierarchical storage system may be a rack mountable mass storage system that is accessible by multiple host 106 computers, such as would be found in a data center or other location where mass storage is needed.

Figure 2:
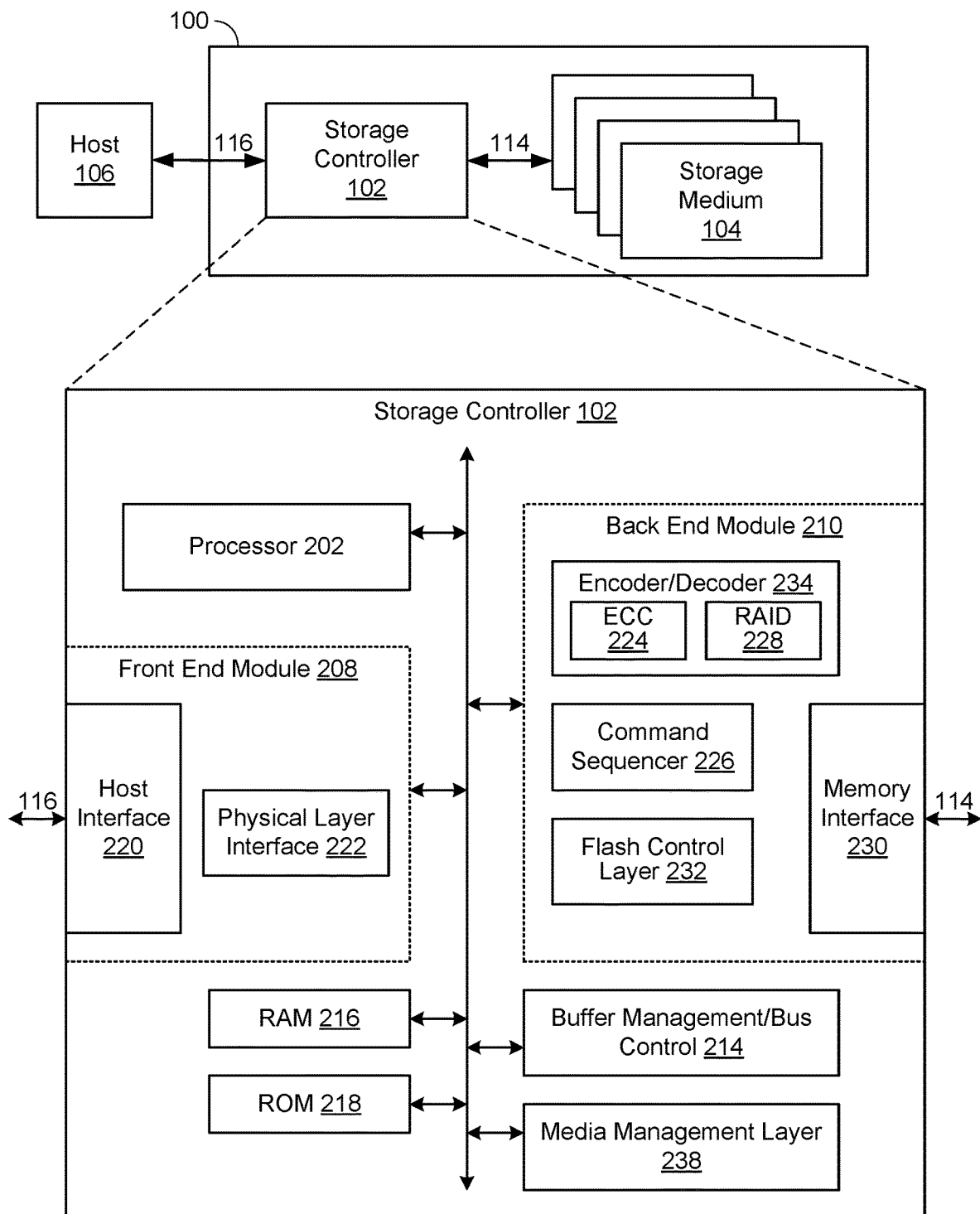
FIG. 2 is a functional block diagram of an example storage controller of the storage system depicted in FIG. 1 in accordance with some implementations.

FIG. 2 is a functional block diagram of an example storage controller 102 of the storage system 100 in accordance with some implementations. Storage controller 102 includes a front-end module 208 that interfaces with a host 106, a back-end module 210 that interfaces with one or more non-volatile storage mediums 104, and various other modules that perform functions described herein.

The storage controller 102 can take the form of processing circuitry, a microprocessor or processor, and a non-transitory computer-readable medium that stores computer-readable program code (e.g., firmware) executable by the (micro) processor, logic gates, switches, an application specific integrated circuit (ASIC), a programmable logic controller, and/or an embedded microcontroller, for example. Storage controller 102 can be configured with hardware and/or firmware to perform the various functions described herein. Also, some of the components shown as being internal to the storage controller 102 (e.g., RAM 216 and ROM 218) can also be stored external to the storage controller 102, and other components can be used. Additionally, the phrase "operatively in communication with" could mean directly in communication with or indirectly (wired or wireless) in communication with through one or more components, which may or may not be shown or described herein.

The components of storage controller 102 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for storage controller 102 to perform the functions described herein.

The storage controller 102 may include a buffer manager/bus controller 214, configured to manage buffers in random access memory (RAM) 216 and control the internal bus arbitration of the storage controller 102. A read only memory (ROM) 218 may store system boot code. Although illustrated in FIG. 2 as located within the storage controller 102, in some implementations one or both of the RAM 216 and ROM 218 may be located separately from the storage controller 102. In yet other implementations, portions of RAM 216 and ROM 218 may be located both within the storage controller 102 and outside the storage controller 102. Further, in some implementations, the storage controller 102, RAM 216, and ROM 218 may be located on separate semiconductor dies.

The storage controller 102 may include one or more processors 202 configured to control the overall operation of the storage controller 102. The processor 202 may issue commands to control circuitry 310 (FIG. 3) of storage medium 104, or to any other component of storage medium 104, via memory interface 230. In some implementations, the ROM 218 and/or RAM 216 may comprise code such as a set of instructions, and the processor 202 may be operable to execute the set of instructions to provide the functionality described herein. Additionally or alternatively, the processor 202 may access code from a portion of the memory array 350 (FIG. 3) in the storage medium 104, such as a reserved area of memory cells connected to one or more word lines.

The front-end module 208 includes a host interface 220 that provides a communication interface with the host 106. The choice of the type of host interface 220 can depend on the type of memory being used. Examples of host interfaces include, but are not limited to, SATA, SATA Express, SAS, Fibre Channel, USB, PCIe, and NVMe. The host interface 220 is a communication interface that facilitates transfer for data, control signals, and timing signals. The host interface 220 may include electrical interface circuitry that provides a physical connection to the channel(s) 116 connecting the storage controller 102 to the host. This electrical interface circuitry may be part of the host interface 220, or may be separately described as a physical layer interface 222.

In some implementations, the host interface 220, in communication with ROM 218, RAM 216, and/or processor 202, may be an electrical circuit that provides an electrical interface between the storage controller 102 and the host 106. For example, the host interface 220 may change the format or timing of signals, provide a buffer, isolate from surges, latch I/O, and so forth. Commands and data from the host 106 are received by the storage controller 102 via the host interface 220. Data sent to the host 106 is transmitted via the host interface 220.

The back-end module 210 includes a memory interface 230 that provides command sequences and data (to be written) to storage medium(s) 104 and receives status information and data (that was read) from storage medium(s) 104. In some implementations, the memory interface 230 may be a double data rate (DDR) interface such as Toggle Mode or ONFI.

In some implementations, the memory interface 230, in communication with ROM 218, RAM 216, and/or processor 202, may be an electrical circuit that provides an electrical interface between the storage controller 102 and the storage medium 104. For example, the memory interface 230 may change the format or timing of signals, provide a buffer, isolate from surges, latch I/O, and so forth.

The back-end module 210 may include an error correction controller (ECC) engine 224 and/or a Redundant Array of Independent Dies (RAID) module 228. The ECC engine 224 may be configured to encode data received from the host 106, and decode and error correct data read from the storage medium 104. The RAID module 228 may be configured to manage generation of RAID parity and recovery of failed data. The RAID parity may be used as an additional level of integrity protection for the data being written into the storage medium 104.

In some implementations, the RAID module 228 may be a part of the ECC engine 224. The RAID parity may be added as an extra die or dies as implied by the common name, but it may also be added within the existing die, e.g., as an extra plane, or extra block, or extra WLs within a block. ECC engine 224 and RAID module 228 may both calculate redundant data that can be used to recover when errors occur and may be considered examples of redundancy encoders. Together, ECC engine 224 and RAID module 228 may be considered to form a combined redundancy encoder/decoder 234.

The back-end module 210 may include a command sequencer 226, and/or a flash control layer 232. The command sequencer 226 may generate command sequences, such as program and erase command sequences, for transmission to storage medium 104. The flash control layer 232 may control the overall operation of the back-end module 210.

The storage controller 102 may include a media management layer 238, which performs wear leveling of memory cells of storage medium 104. The storage controller 102 may also include other discrete components (not shown), such as external electrical interfaces, external RAM, resistors, capacitors, or other components that may interface with storage controller 102. In some implementations, one or more of the physical layer interface 222, RAID module 228, media management layer 238 and buffer management/bus controller 214 are optional components that are not necessary in the storage controller 102.

The Flash Translation Layer (FTL) or Media Management Layer (MML) 238 may be integrated as part of the flash management that may handle flash errors and interfacing with the host 106. In particular, the MML 238 may be a module in flash management and may be responsible for the internals of NAND management. In particular, the MML 238 may include an algorithm in the storage device firmware which translates writes from the host 106 into writes to the storage medium 104.

The MML 238 may be needed because: 1) storage medium 104 may have limited endurance; 2) storage medium 104 may only be written in multiples of pages; and/or 3) a selected portion of memory cells of the storage medium 104 may not be written unless it is erased as a block (i.e. a block may be considered to be a minimum unit of erase and such a non-volatile memory may be considered a block-erasable non-volatile memory). The MML 238 may address these potential limitations of the storage medium 104 which may not be visible to the host 106. Accordingly, the MML 238 may translate write operations received from the host 106 into write operations for transmission to the storage medium 104.

Figure 3:
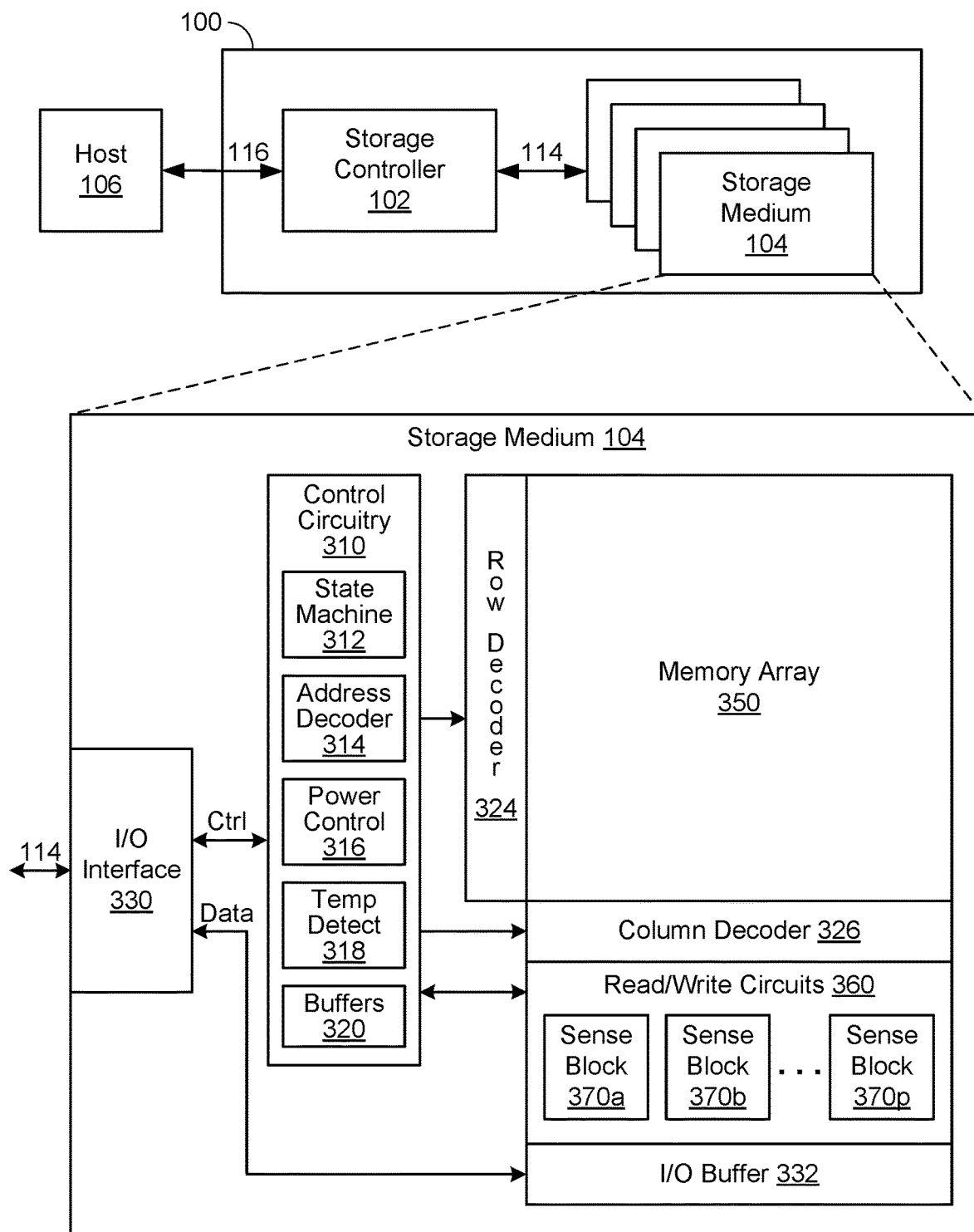
FIG. 3 is a functional block diagram of an example storage medium of the storage system depicted in FIG. 1 in accordance with some implementations.

FIG. 3 is a functional block diagram of an example storage medium 104 of the storage system 100 in accordance with some implementations. Storage medium 104 includes a memory array 350 including a plurality of memory cells, control circuitry 310, read/write circuits 360, and an input/output (I/O) interface 330.

In some implementations, a storage controller 102 (as described above with reference to FIG. 2) may included in the same storage device (e.g., a removable storage card) as the storage medium(s) 104. However, in other implementations, the storage controller 102 may be separated from the storage medium(s) 104. In some implementations, the storage controller 102 may be disposed on a different die than the storage medium 104. In some implementations, one storage controller 102 may communicate with a plurality of storage mediums 104. In some implementations, each storage medium 104 may have its own storage controller 102.

Commands and data may be transferred between the host 106 and the storage controller 102 via a data bus 116, and between the storage controller 102 and storage medium(s) 104 via an interface channel 114. In some implementations, the I/O interface 330 includes a set of I/O pins (also referred to as pads) that connect to respective communication lines of the interface channel 114. The I/O interface 330 may be connected to the control circuitry 310, row decoder 324, column decoder 326, read/write circuits 360, and/or memory array 350.

The I/O interface 330 may be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 900) is an asynchronous memory interface that supports SDR and DDR with a DQS signal acting as a data strobe signal.

Data received at the I/O interface 330 for writing to the memory array 350 (in accordance with a write command) is latched in an I/O buffer 332 before being written to the memory array 350. Similarly, data that is read from the memory array 350 (in accordance with a read command) is latched in the I/O buffer 332 before being transmitted to the storage controller 102 via the I/O interface 330. The I/O buffer 332 may be included in the I/O interface 330 or otherwise communicatively coupled to the I/O interface 330. The I/O buffer 332 includes a plurality of data latches. In some implementations, the data latches are arranged in groups of 8 (XDL0 through XDL7) or 16 (XDL0 through XDL15), depending on how many bits the I/O interface 330 is configured to receive or transmit at a time.

The read/write circuits 360 include multiple sense blocks 370 including 370a through 370p (sensing circuitry) and allow a page (or multiple pages) of data in multiple memory cells of the memory array 350 to be read or programmed (written) in parallel. In some implementations, each sense block 370 includes one or more sense amplifiers connected to respective bit lines of the memory array 350. The sense amplifiers sense voltage signals associated with selected memory cells (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Each bit line of the memory array 350 is coupled to a sense block 370, each of which includes one or more sense amplifiers. The sense amplifiers sense voltages on each bit line in accordance with read operations. The sense amplifiers sense the low power signals from respective bit lines that represents data bits (1 or 0) stored in respective memory cells. The sense amplifiers amplify small voltage swings to recognizable logic levels so the data can be interpreted properly by logic outside the memory array (e.g., storage controller 102). After a sense amplifier for a particular bit line amplifies the sensed voltage to a normal logic level, the bit from the desired cell is then latched from the cell's sense amplifier into a data latch in the I/O buffer 332, and transferred to the storage controller 102 on data lines DQ of the output bus 114.

The sense amplifiers sense data read onto corresponding bit lines from a plurality of memory cells associated with the corresponding bit lines. The sense amplifiers may include bit line drivers for applying a voltage to corresponding bit lines in accordance with write data. The sense amplifier for a given bit line or group of bit lines may directly control the bit line(s). In data reading, the read/write circuits 360 may apply a strobe signal to a given sense amplifier. The sense amplifier determines data at the assertion timing of the strobe signal (e.g., an ON state of a memory cell may be defined as data "0", and an off state may be defined as data "1"). This data may be held in an internal latch SADL of the sense amplifier before being transferred to one of the data latches of the I/O buffer 332.

Input and output of data to and from the sense amplifiers are performed via the data latches of the I/O buffer 332. That is, data received from the storage controller 102 is transferred to sense amplifiers via the data latches. In addition, data in the sense amplifiers (in internal latches of the sense amplifiers) is transmitted to the storage controller 102 via the data latches. The data latches of the I/O buffer 332 may function as the cache memory of the storage medium 104.

The control circuitry 310 cooperates with the read/write circuits 360 to perform memory operations (e.g., write, read, erase, and others) on the memory array 350. In some implementations, control circuitry 310 includes a state machine 312, an on-chip address decoder 314, a power control circuit 316, a temperature detection circuit 318, and/or buffers 320.

The state machine 312 provides die-level control of memory operations. In some implementations, the state machine 312 is programmable by software. In other implementations, the state machine 312 does not use software and is completely implemented in hardware (e.g., electrical circuits). In some implementations, the state machine 312 can be replaced by a microcontroller or microprocessor.

The address decoder 314 provides an address interface between addresses used by the host 106 or storage controller 102 to the hardware address used by the decoders 324 and 326.

The power control module 316 controls the power and voltages supplied to the word lines and bit lines during memory operations. It can include drivers for word line layers (discussed below) in a 3D configuration, select transistors (e.g., SGS and SGD transistors, described below) and source lines. Power control module 316 may include charge pumps for creating voltages.

The temperature detection circuit 318 may be configured to detect temperature in or around the storage medium 104. The temperature detection circuit 318 may include an on-chip temperature sensor.

The buffers 320 may be registers, ROM fuses, and/or other storage devices for storing default values such as base voltages and other parameters.

Any one or any combination of control circuitry 310, state machine 312, decoders 314/324/326, temperature detection circuit 318, power control module 316, sense blocks 370, read/write circuits 360, and storage controller 102 can be considered one or more control circuits (or managing circuitry, or peripheral circuitry) that performs the functions described herein.

The memory array 350 may be addressable by word lines via a row decoder 324 and by bit lines via a column decoder 326. The memory array 350 may comprise one or more 2D or 3D arrays of memory cells. The memory array 350 may comprise a monolithic 3D memory array in which multiple memory levels are formed above (and not in) a single substrate, such as a wafer, with no intervening substrates.

The memory array 350 may comprise any type of non-volatile memory that is monolithically formed in one or more physical levels of arrays of memory cells having an active area disposed above a silicon substrate. The memory array 350 may be in a non-volatile memory device having circuitry associated with the operation of the memory cells, whether the associated circuitry is above or within the substrate.

Multiple memory elements in memory array 350 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. In some implementations, the non-volatile memory cells of memory array 350 comprise vertical NAND strings with charge-trapping material. In such a configuration, a NAND string includes memory cells connected by a channel.

A NAND flash memory array 350 may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array 350 may be arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory array 350 may be vertically arranged as a stack of multiple two-dimensional memory device levels. As another non-limiting example, a three-dimensional memory array 350 may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of a non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

In some implementations, the memory array 350 comprises a two dimensional memory array of non-volatile memory cells. In one example, the non-volatile memory cells are NAND flash memory cells utilize floating gates. Other types of memory cells (e.g., NOR-type flash memory) can also be used.

The exact type of memory array architecture or memory cells included in the memory array 350 is not limited to the examples above. Many different types of memory array architectures or memory cell technologies can be used to form the memory array 350. No particular non-volatile memory technology is required for purposes of the implementations described herein. Other examples of suitable technologies for memory cells of the memory array 350 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of the memory array 350 include two dimensional arrays, three dimensional arrays, cross-point arrays, stacked two dimensional arrays, vertical bit line arrays, and the like.

A person of ordinary skill in the art will recognize that the technology described herein is not limited to a single specific memory array, but covers many relevant memory arrays within the spirit and scope of the technology as described herein and as understood by one of ordinary skill in the art.

Figure 4A:
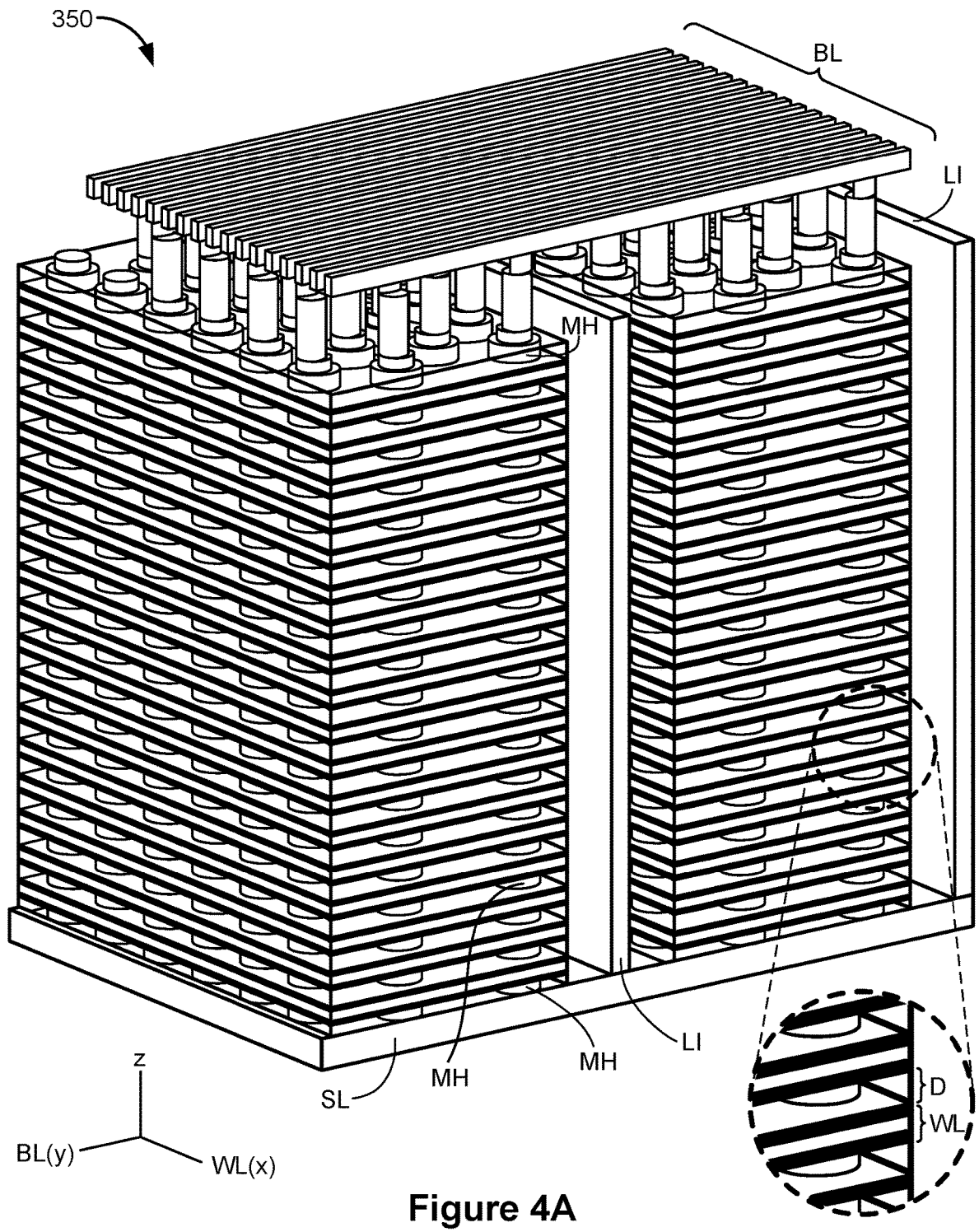
FIG. 4A is a perspective view of a portion of one implementation of a three-dimensional monolithic memory array in accordance with some implementations.

FIG. 4A is a perspective view of a portion of an example implementation of a monolithic three dimensional memory array that may comprise memory array 350, which includes a plurality of non-volatile memory cells. For example, FIG. 4A shows a portion of one block of memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as WL.

The number of alternating dielectric layers and conductive layers can vary based on specific implementation requirements. One set of implementations includes between 104-216 alternating dielectric layers and conductive layers. One example implementations includes 96 data word line layers, 8 select layers, 6 dummy word line layers and 110 dielectric layers. More or less than 104-216 layers can also be used. As will be explained below, the alternating dielectric layers and conductive layers may be divided into four "fingers" or sub-blocks by local interconnects LI. FIG. 4A shows two fingers and two local interconnects LI.

Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 4A, the dielectric layers are depicted as see-through so that the reader can see the memory holes positioned in the stack of alternating dielectric layers and conductive layers.

In some implementations, NAND strings are formed by filling the vertical column/memory hole with materials including a charge-trapping material to create a vertical column of memory cells. Each memory cell can store one or more bits of data. More details of the three dimensional monolithic memory array that comprises memory array 350 is provided below with reference to FIG. 4B-4F.

Figure 4B:
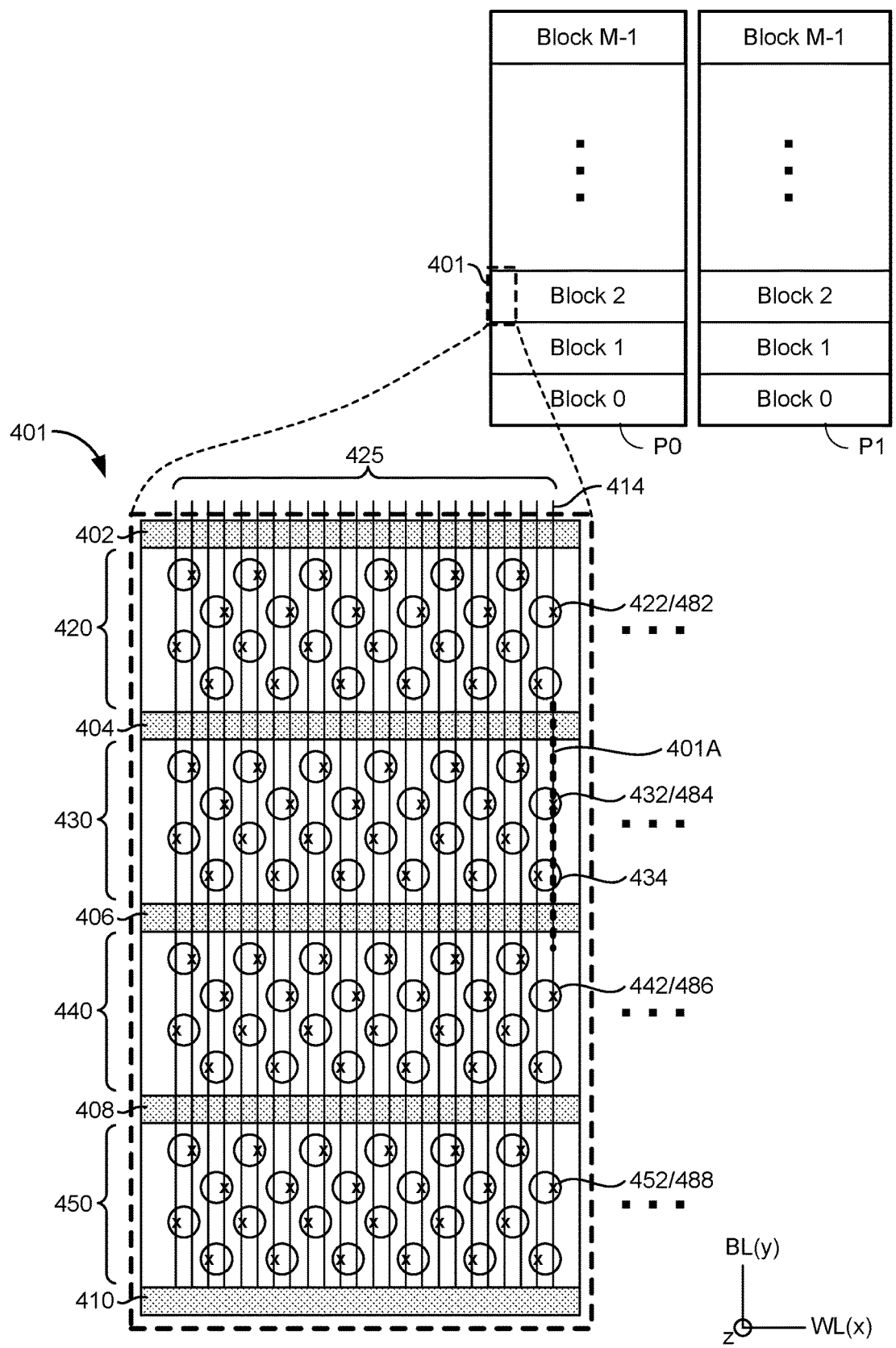
FIG. 4B is a block diagram of a memory array having two planes, and a top view of a portion of a block of memory cells in accordance with some implementations.

FIG. 4B depicts an example three dimensional (3D) NAND structure that corresponds to the structure of FIG. 4A and can be used to implement memory array 350 of FIG. 3. The memory array 350 may be divided into two planes P0 and P1. Each plane may be divided into M blocks. In one example, each plane has about 2000 blocks. However, different numbers of blocks and planes can also be used. In some implementations, a block of memory cells is a unit of erase. That is, all memory cells of a block are erased together.

In some implementations, memory cells can be grouped into blocks for other reasons, such as to organize the memory array 350 to enable the signaling and selection circuits. In some implementations, a block represents a groups of connected memory cells as the memory cells of a block share a common set of unbroken word lines and unbroken bit lines. Block 0 and block M−1 of both planes P0 and P1 may be referred to as being located in an edge region/section of the memory array 350.

FIG. 4B further includes a detailed top view of a portion 401 of one block from the memory array 350. The block depicted in portion 401 extends in the x direction. In some implementations, the memory array 350 has many layers; however, FIG. 4B only shows the top layer.

FIG. 4B depicts a plurality of circles that represent the vertical columns MH. Each of the vertical columns include multiple select transistors (also referred to as a select gate or selection gate) and multiple memory cells. In some implementations, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the x direction, the block includes more vertical columns than depicted in FIG. 4B.

FIG. 4B also depicts a set of bit lines 425, including bit line 414. FIG. 4B shows twenty four bit lines because only a portion of the block is depicted. More than twenty four bit lines may be connected to vertical columns of the block. Each of the circles representing vertical columns has an "x" to indicate its connection to one bit line. For example, bit line 414 is connected to vertical columns 422, 432, 442 and 452 (but not vertical column 434). In some implementations, bit lines are positioned over the memory array 350 and run along the entire length of the plane (e.g., from the top of plane P0 to the bottom of plane P0).

The block depicted in FIG. 4B includes a set of local interconnects 402, 404, 406, 408, and 410 that connect the various layers to a source line below the vertical columns. Local interconnects 402, 404, 406, 408, and 410 also serve to divide each layer of the block into four regions. For example, the top layer depicted in FIG. 4B is divided into regions 420, 430, 440, and 450, which are referred to as fingers or sub-blocks. In the layers of the block that implement memory cells, the four regions are referred to as word line fingers that are separated by the local interconnects.

In some implementations, the word line fingers on a common level of a block connect together to form a single word line. In some implementations, the word line fingers on the same level are not connected together. In one example implementation, a bit line only connects to one vertical column in each of regions 420, 430, 440 and 450. For such an implementation, each block has sixteen rows of active columns and each bit line connects to four rows in each block.

In some implementations, all of four rows connected to a common bit line are connected to the same word line (via different word line fingers on the same level that are connected together). Therefore, the address decoders use the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other implementations may include more or fewer regions per block, more or less rows of vertical columns per region and more or less rows of vertical columns per block. FIG. 4B also shows the vertical columns being staggered. In other implementations, different patterns of staggering can be used. In some implementations, the vertical columns are not staggered.

Figure 4C:
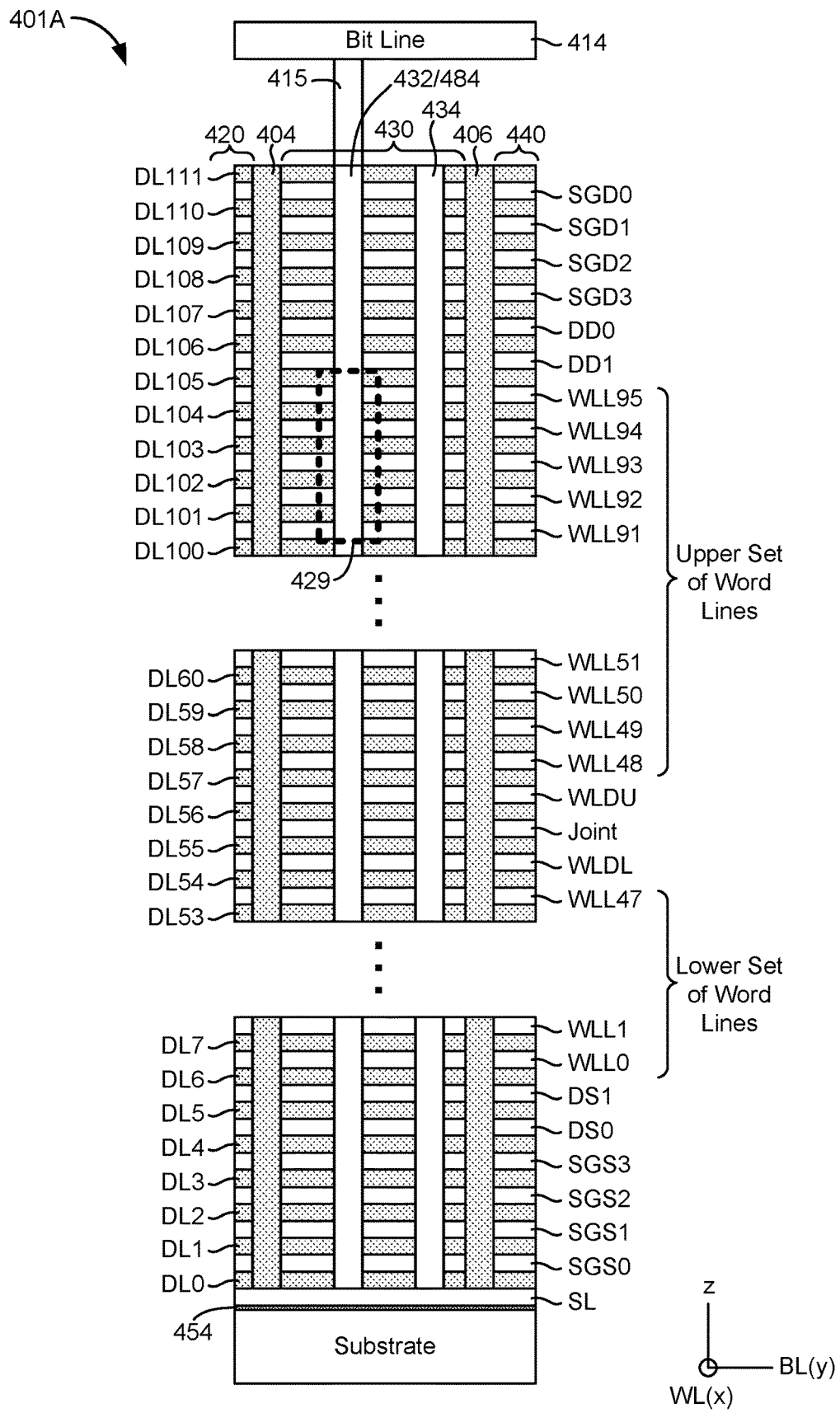
FIG. 4C depicts a cross sectional view of a portion of a block of memory cells in accordance with some implementations.

FIG. 4C depicts a portion of some implementations of the three dimensional memory array 350 showing a cross-sectional view along line 401A of FIG. 4B. This cross sectional view cuts through vertical columns 432 and 434 and region 430 (see FIG. 4B).

The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety-six data word line layers WLL0-WLL95 for connecting to data memory cells. Other implementations can implement more or less than four drain side select layers, more or less than four source side select layers, more or less than six dummy word line layers, and more or less than ninety six word lines.

Vertical columns 432 and 434 are depicted protruding through the drain side select layers, source side select layers, dummy word line layers and word line layers. In some implementations, each vertical column comprises a vertical NAND string. For example, vertical column 432 comprises NAND string 484. Below the vertical columns and the layers listed below is the substrate, an insulating film 454 on the substrate, and the source line SL. The NAND string of vertical column 432 has a source end at a bottom of the stack and a drain end at a top of the stack. As in agreement with FIG. 4B, FIG. 4C shows vertical column 432 connected to bit line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In some implementations, the conductive layers are made from a combination of TiN and Tungsten. In other implementations, other materials can be used to form the conductive layers, such as doped polysilicon, metal such as Tungsten or metal silicide.

In some implementations, different conductive layers can be formed from different materials. Between conductive layers are dielectric layers DL0-DL111. For example, dielectric layer DL104 is above word line layer WLL94 and below word line layer WLL95. In some implementations, the dielectric layers are made from SiO2. In other implementations, other dielectric materials can be used to form the dielectric layers.

The non-volatile memory cells are formed along vertical columns which extend through alternating conductive and dielectric layers in the stack. In some implementations, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host 106, such as data from a user of the host 106), while a data memory cell is eligible to store host data. In some implementations, data memory cells and dummy memory cells may have the same structure. A dummy word line is connected to dummy memory cells.

Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a joint area. In some implementations it is expensive and/or challenging to etch ninety six word line layers intermixed with dielectric layers. To ease this burden, some implementations include laying down a first stack of forty eight word line layers alternating with dielectric layers, laying down the joint area, and laying down a second stack of forty eight word line layers alternating with dielectric layers.

The joint area is positioned between the first stack and the second stack. The joint area is used to connect the first stack to the second stack. In FIG. 4C, the first stack is labeled as the "Lower Set of Word Lines" and the second stack is labeled as the "Upper Set of Word Lines." In some implementations, the joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
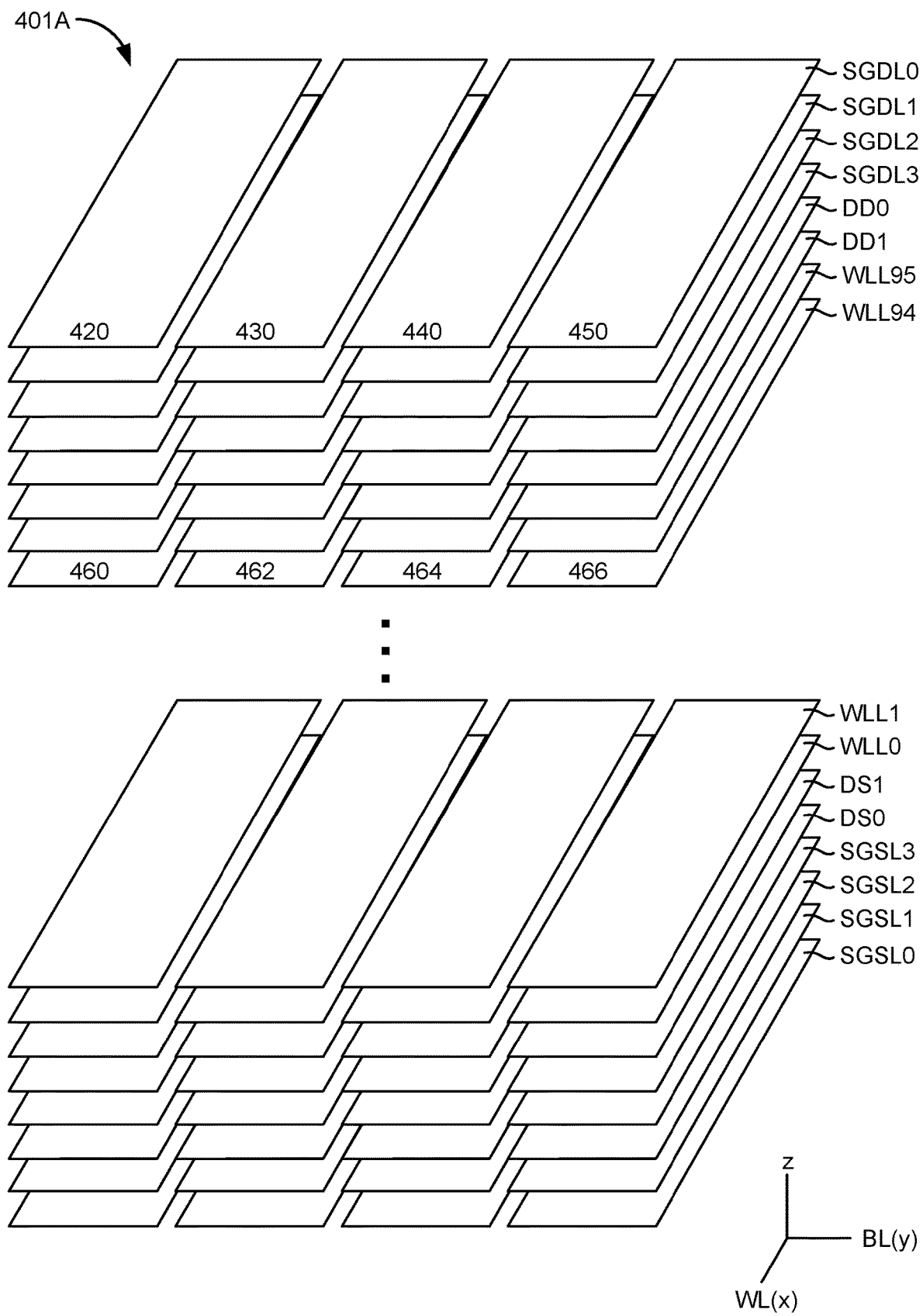
FIG. 4D depicts a view of the select gate layers and word line layers in accordance with some implementations.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with reference to FIG. 4B, in some implementations local interconnects 402, 404, 406, 408, and 410 break up the conductive layers into four regions/fingers (or sub-blocks).

For example, word line layer WLL94 is divided into regions 460, 462, 464, and 466. For the word line layers (WLL0-WLL95), the regions are referred to as word line fingers. For example, word line layer WLL94 is divided into word line fingers 460, 462, 464, and 466. For example, region 460 is one word line finger on one word line layer. In some implementations, each word line finger on the same level is connected together. In some implementations, each word line finger operates as a separate word line.

Drain side select gate layer SGD0 (the top layer) is also divided into regions 420, 430, 440, and 450, also known as fingers or select line fingers. In some implementations, each select line finger on the same level is connected together. In some implementations, each select line finger operates as a separate word line.

Figure 4E:
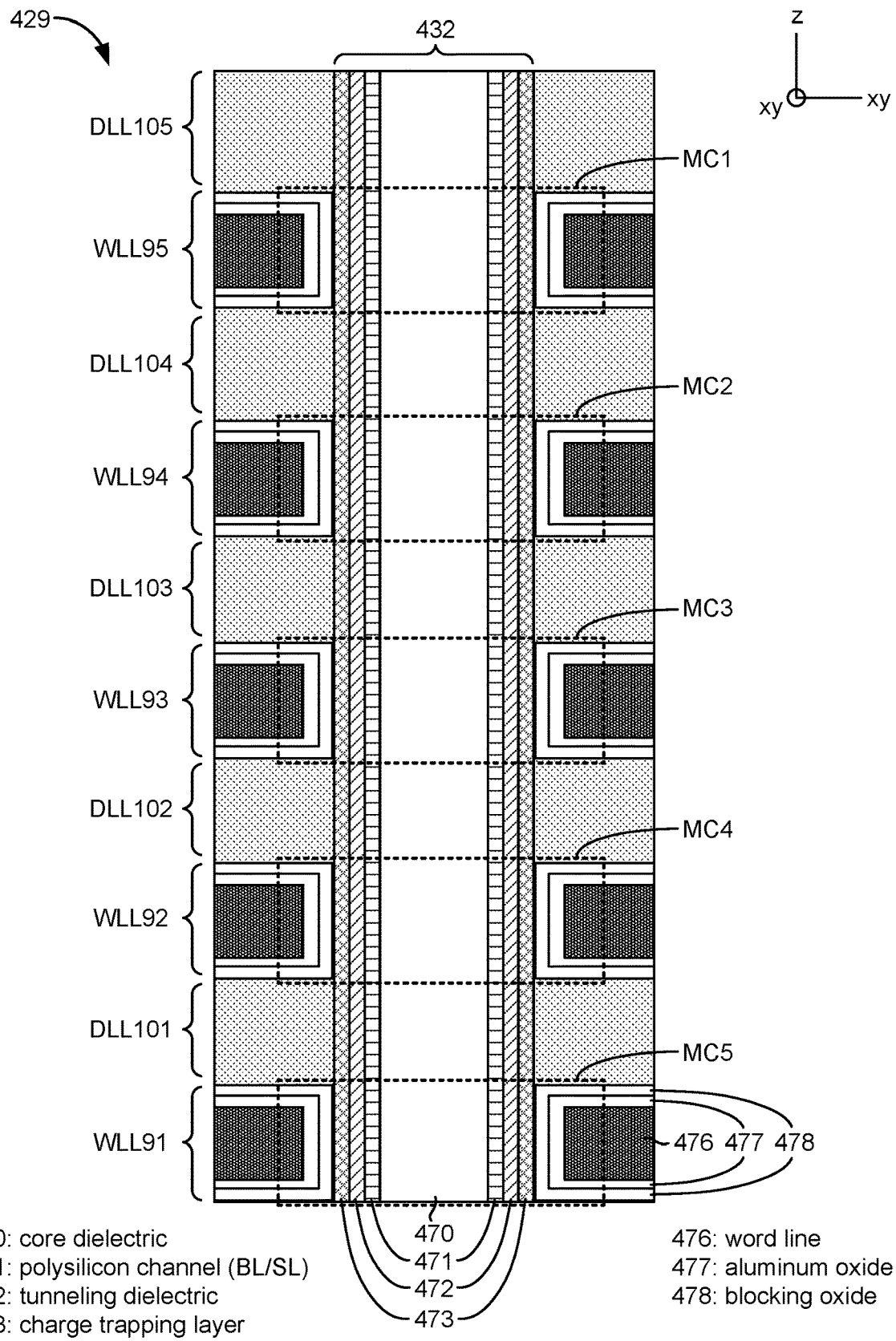
FIG. 4E is a cross sectional view of a vertical column of memory cells in accordance with some implementations.

FIG. 4E depicts a cross sectional view of region 429 of FIG. 4C that includes a portion of vertical column 432 (a memory hole) that extends through the alternating conductive layers and dielectric layers. In some implementations, the vertical columns are round; however, in other implementations other shapes can be used. In some implementations, vertical column 432 includes an inner core layer 470 that is made of a dielectric, such as SiO2. Other materials can also be used.

Surrounding inner core 470 is polysilicon channel 471. Materials other than polysilicon can also be used. Note that it is the channel 471 that connects to the bit line and the source line. Surrounding channel 471 is a tunneling dielectric 472. In some implementations, tunneling dielectric 472 has an ONO structure. Surrounding tunneling dielectric 472 is charge trapping layer 473, such as (for example) silicon nitride. Other memory materials and structures can also be used. The technology described herein is not limited to any particular material or structure.

FIG. 4E depicts dielectric layers DLL105, DLL104, DLL103, DLL102, and DLL101, as well as word line layers WLL95, WLL94, WLL93, WLL92, and WLL91. Each of the word line layers includes a word line region 476 surrounded by an aluminum oxide layer 477, which is surrounded by a blocking oxide (e.g., SiO2) layer 478. The physical interaction of the word line layers with the vertical column forms the memory cells. Thus, a memory cell, in some implementations, comprises channel 471, tunneling dielectric 472, charge trapping layer 473, blocking oxide layer 478, aluminum oxide layer 477 and word line region 476.

For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge.

In some implementations, the programming is achieved through Fowler-Nordheim (FN) tunneling of the electrons into the charge trapping layer. During an erase operation, the electrons return to the channel or holes are injected into the charge trapping layer to recombine with electrons. In some implementations, erasing is achieved using hole injection into the charge trapping layer via a physical mechanism such as gate induced drain leakage (GIDL).

Figure 4F:
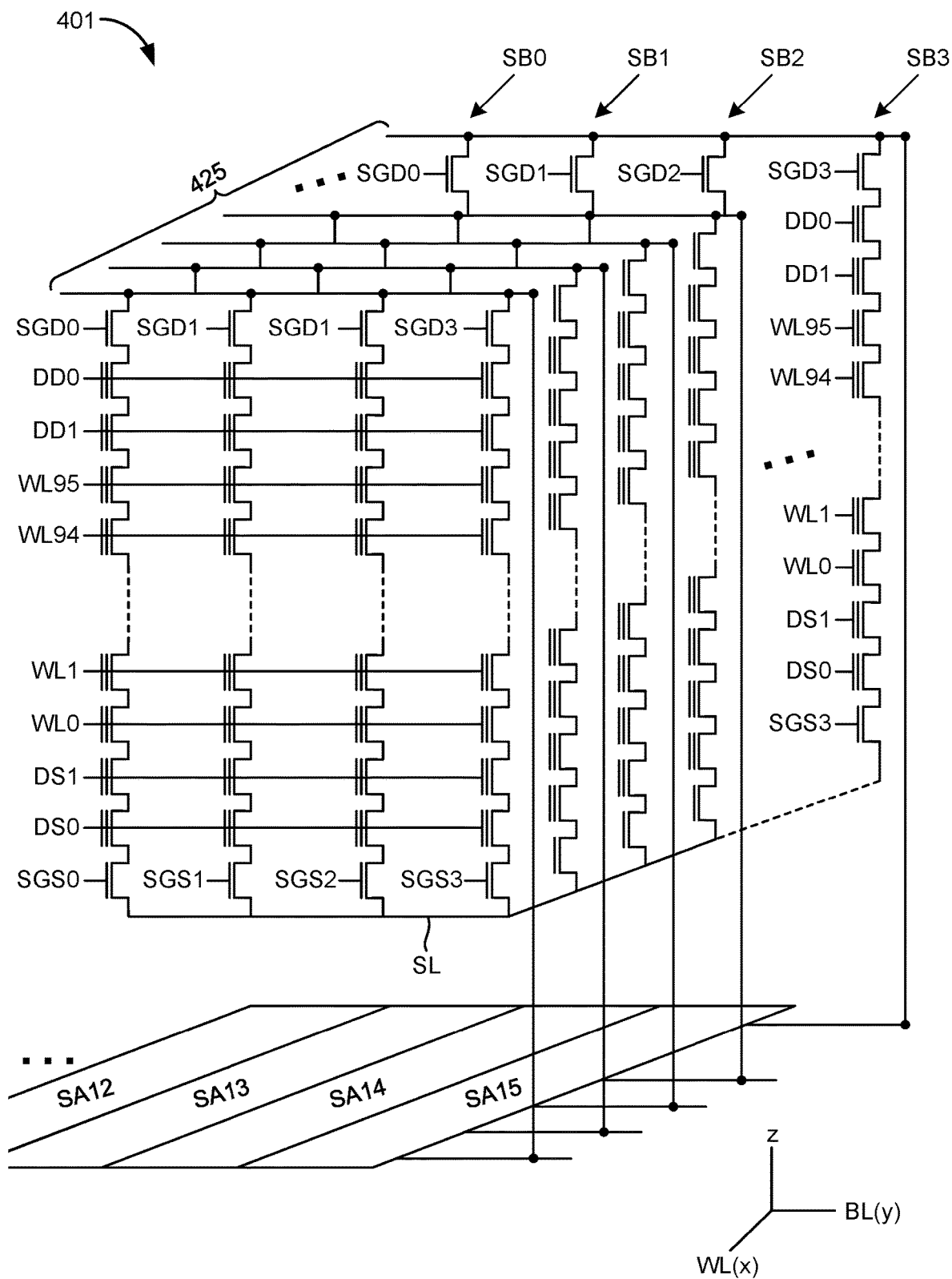
FIG. 4F is a schematic of a plurality of NAND strings in accordance with some implementations.

FIG. 4F is a schematic diagram of a portion of the memory array 350 depicted in FIGS. 4A-4E. FIG. 4A shows physical word lines WLL0-WLL95 running across the entire block. The structure of FIG. 4F corresponds to portion 401 in Block 2 of FIGS. 4B-4E including bit lines 425. Within the block, each bit line is connected to four NAND strings.

Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Each bit line 425 is connected to sense amplifiers in the peripheral circuitry of the storage medium 104 (e.g., in sense blocks 370 of the read/write circuits 360). The sense amplifiers sense voltage signals associated with selected memory cells of the respective NAND strings corresponding to each bit line (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Memory cells in the various implementations of the memory array 350 described above can be erased, programmed, and read. At the end of a successful programming process (with verification), the threshold voltages of the memory cells should be within one or more distributions (ranges) of threshold voltages for programmed memory cells or within a distribution (range) of threshold voltages for erased memory cells, as appropriate.

Figure 5A:
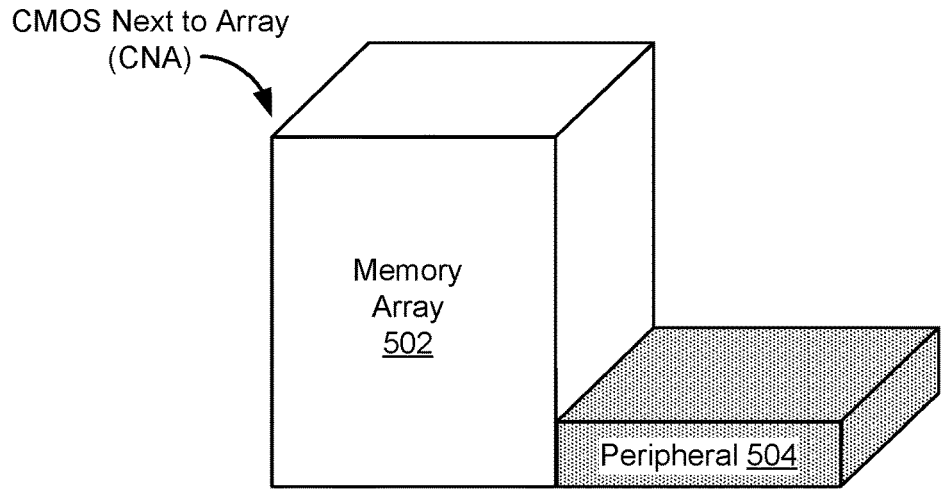
FIG. 5A is a perspective view of a CMOS Next to Array (CNA) memory structure in accordance with some implementations.
Figure 5A:
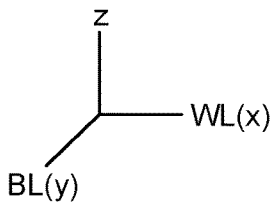

FIG. 5A is a perspective view of a CMOS Next to Array (CNA) memory structure in accordance with some implementations. The CNA structure includes a memory array 502 and peripheral circuitry (including control circuits and sense amplifiers SA) 504.

Memory array 502 corresponds to the three-dimensional memory array 350 described above with reference to FIGS. 3 and 4A-4F. Peripheral circuitry 504 corresponds to any one or any combination of control circuitry 310, state machine 312, decoders 314/324/326, power control module 316, temperature detection circuit 318, buffers 320, sense blocks 370, read/write circuits 360, and storage controller 102 described above with reference to FIGS. 1-4F. For example, peripheral circuitry 504 may include voltage regulators, charge pumps, page buffers, sense amplifiers, logic circuits, redundancy structures, level shifters, and so forth.

In some instances, the sense amplifiers may be separately referred to as sense amplifier (SA) circuitry, and the rest of the peripheral circuitry may be separately referred to as peripheral control (PERI) circuitry.

As the memory array 502 grows taller (with successive generations of development), the peripheral circuits take up a higher percentage of the total die size. As a result, memory scaling cost benefits are reduced accordingly. The overcome the issue of peripherals taking up too large an area and too high a percentage of the total die size, the peripheral circuitry can be hidden underneath the array, referred to as CMOS under array (CUA). Another alternative is to build the peripheral circuits on a different CMOS wafer and then bond the memory wafer with the CMOS wafer using wafer-to-wafer microbonding, referred to as CMOS bonded array (CBA).

Building the memory array 502 and the peripheral circuitry 504 on the same wafer (CUA) reduces cost. However, thermal processes needed to anneal the memory array may impact the peripheral transistors on the same wafer, degrading the capabilities of the peripheral transistors.

Building the memory array and the peripheral circuitry on two different wafers (CBA) avoids the extra thermal impact, so the peripheral circuit quality is better able to produce higher interface IO speeds. However, manufacturing costs are greater due to the cost of processing two wafers, along with the cost of extra mechanical bonding processes between the two wafers.

Figure 5B:
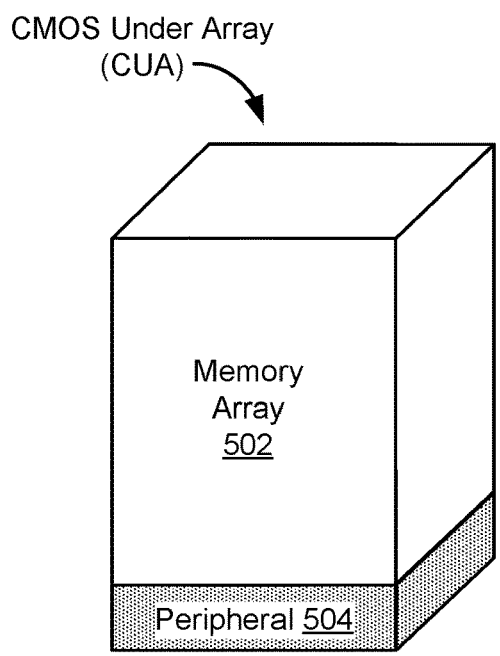
FIG. 5B is a perspective view of a CMOS under array (CUA) memory structure in accordance with some implementations.

FIG. 5B is a perspective view of a CMOS under array (CUA) memory structure in accordance with some implementations. The CUA structure includes a memory array 502 and peripheral circuitry 504.

The memory array 502 corresponds to the three-dimensional memory array 350 described above with reference to FIGS. 3 and 4A-4F. In one example implementation, the length of the plane in the x-direction represents a direction in which signal paths for word lines extend (a word line or SGD line direction), and the width of the plane in the y-direction, represents a direction in which signal paths for bit lines extend (a bit line direction). The z-direction represents a height of the storage device.

Peripheral circuitry 504 corresponds to any one or any combination of control circuitry 310, state machine 312, decoders 314/324/326, power control module 316, temperature detection circuit 318, buffers 320, sense blocks 370, read/write circuits 360, and storage controller 102 described above with reference to FIGS. 1-4F. For example, peripheral circuitry 504 may include voltage regulators, charge pumps, page buffers, sense amplifiers, logic circuits, redundancy structures, level shifters, and so forth. In some instances, the sense amplifiers may be separately referred to as sense amplifier (SA) circuitry, and the rest of the peripheral circuitry may be separately referred to as peripheral control (PERI) circuitry.

In the CUA memory structure, the peripheral circuitry 504 is implemented underneath the vertical stack of memory cells in memory array 502. Implementing the peripheral circuitry 502 underneath the memory 502 saves die space, which allows more die space to be used for memory cells and increases the amount of space available for peripheral circuitry.

Figure 5C:
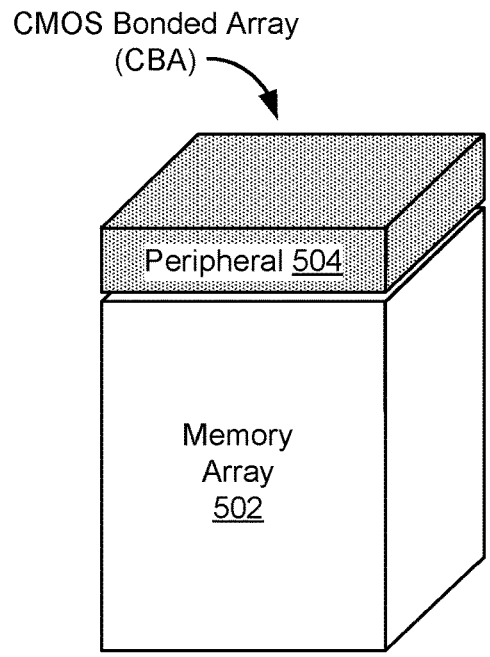
FIG. 5C is a perspective view of a CMOS bonded array (CBA) memory structure in accordance with some implementations.

FIG. 5C is a perspective view of a CMOS bonded array (CBA) memory structure in accordance with some implementations. The CBA structure includes a memory array 502 and peripheral circuitry 504.

The memory array 502 corresponds to the three-dimensional memory array 350 described above with reference to FIGS. 3 and 4A-4F. In one example implementation, the length of the plane in the x-direction represents a direction in which signal paths for word lines extend (a word line or SGD line direction), and the width of the plane in the y-direction, represents a direction in which signal paths for bit lines extend (a bit line direction). The z-direction represents a height of the storage device.

Peripheral circuitry 504 corresponds to any one or any combination of control circuitry 310, state machine 312, decoders 314/324/326, power control module 316, temperature detection circuit 318, buffers 320, sense blocks 370, read/write circuits 360, and storage controller 102 described above with reference to FIGS. 1-4F. For example, peripheral circuitry 504 may include voltage regulators, charge pumps, page buffers, sense amplifiers, logic circuits, redundancy structures, level shifters, and so forth. In some instances, the sense amplifiers may be separately referred to as sense amplifier (SA) circuitry, and the rest of the peripheral circuitry may be separately referred to as peripheral control (PERI) circuitry.

In the CBA memory structure, the peripheral circuitry 504 is implemented in a different wafer than the wafer in which the memory cells in memory array 502 are implemented. Implementing the peripheral circuitry 502 in such a manner saves die space, which allows more die space to be used for memory cells and increases the amount of space available for peripheral circuitry.

From a system point of view, the benefits of the different architectures in FIGS. 5A-5C are reflected in their write throughput. Write throughput is a critical performance indicator and is determined by the amount of data, such as 32 KB, that is programmed all at once. In a CNA architecture, such as a two-plane chip architecture (e.g., planes P0 and P1 in FIG. 4B), a total of 32 KB of data (or more) can be programmed together per chip.

A four-plane architecture can also be made (described in more detail below). Such an architecture may be more expensive due to the extra die size needed to add more SAs for each plane. However, in the CUA architecture, extra SAs can be included without an extra die size penalty. Four-plane devices may have 64 KB of data (or more) programmed together per chip to double the write throughput compared with a two-plane chip. As the number of layers grows ever higher, the array size in the xy direction will be reduced for the same capacity. In this case, the capacity of the storage medium 104 die may be increased to ensure the peripheral circuits 504 are totally (or substantially) hidden under the array 502.

Figure 6A:
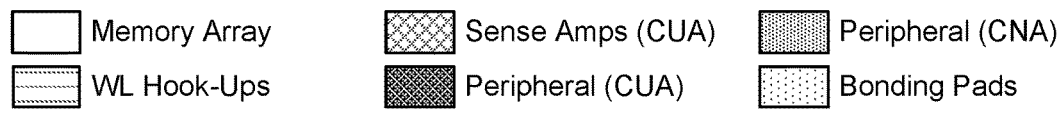
FIGS. 6A-6C depict different views of a four-plane CUA or CBA storage medium 104 architecture implementing TLC and/or QLC memory cells in accordance with some implementations.
Figure 6A:
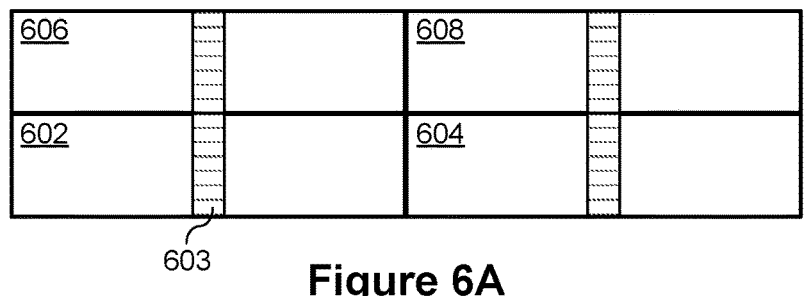
Figure 6B:
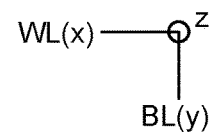
Figure 6B:
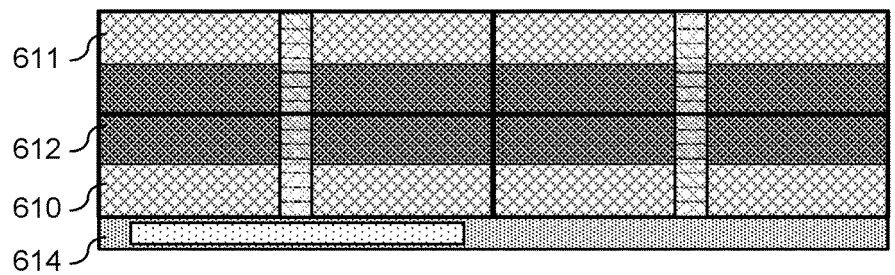
Figure 6C:
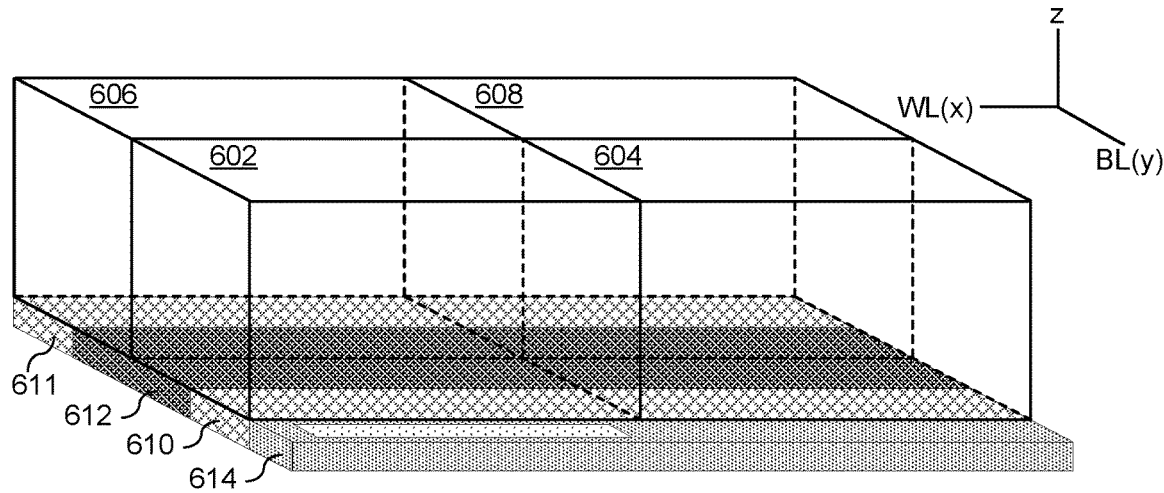

FIGS. 6A-6C depict different views of a four-plane CUA or CBA storage medium 104 architecture implementing TLC and/or QLC memory cells in accordance with some implementations. While the figures depict CUA architecture, the concepts described herein apply equally to CBA.

FIG. 6A depicts a top-down view of a four-plane CUA structure 600 implementing TLC and/or QLC memory cells in accordance with some implementations. Peripheral circuitry is not depicted in this figure, so as to highlight the layout of the planes. CUA structure 600 corresponds to storage medium 104 of storage system 100 (FIG. 3), and the physical implementation of word lines, bit lines, memory cells, and so forth, of each plane corresponds to the description above with reference to FIGS. 4A-4F.

CUA structure 600 includes four planes 602, 604, 606, and 608. In some implementations, each plane stores 16 KB of data. In other implementations, each plane may store more than 16 KB or less than 16 KB of data.

In the context of the top-down view, the word lines in each plane run horizontally (in the x direction), and the bit lines run vertically (in the y direction). The word lines in each plane are coupled to word line hookups (e.g., 603). The word line hookups are necessary for the internal connections of each word line layer to corresponding memory cells.

FIG. 6B depicts a top-down view of the four-plane CUA structure 600 with peripheral circuitry in accordance with some implementations. The peripheral circuitry includes CUA components (under the planes) and CNA components (next to the planes).

The CUA components of the peripheral circuitry overlap (underneath) the four planes of the memory array. The CUA components include sense amplifier (SA) circuitry 610 and 611, and peripheral control circuitry 612. The SA circuitry 610 and 611 corresponds to the sense blocks 370 in FIG. 3, and the peripheral control circuitry 612 corresponds to the control circuitry 310 in FIG. 3. SA circuitry 610 is connected to planes 602 and 604, and SA circuitry 611 is connected to planes 606 and 608. Peripheral control circuitry 612 is located between SA circuitry 610 and 611, and is connected to all four planes 602, 604, 606, and 608.

The CNA components of the peripheral circuitry are located adjacent to the memory array. While all SA circuits and almost all peripheral circuits may be placed under the array, some critical circuits must be placed outside of the array. Such components include peripheral control circuitry 614, including components that must connect to other hardware components outside of the memory array. For example, bonding pads (including IO pads and power pads) are located in the CNA portion of the peripheral circuitry. The bonding pads may be located at one side of the chip to enable multi-die packaging.

FIG. 6C depicts a perspective view of the four-plane CUA structure 600 with peripheral circuitry in accordance with some implementations. The word line hookups are not depicted in this figure, so as to highlight the relationship between the peripheral circuits and the planes of the memory array.

The design of CUA structure 600 supports scaling, since increasing the number of WL layers reduces cost because more bits may be packed into the same surface area. Further, the peripheral circuitry required to support increased memory capacity may continue to be implemented underneath the memory array as the technology continues to scale.

Figures 7A, 7B:
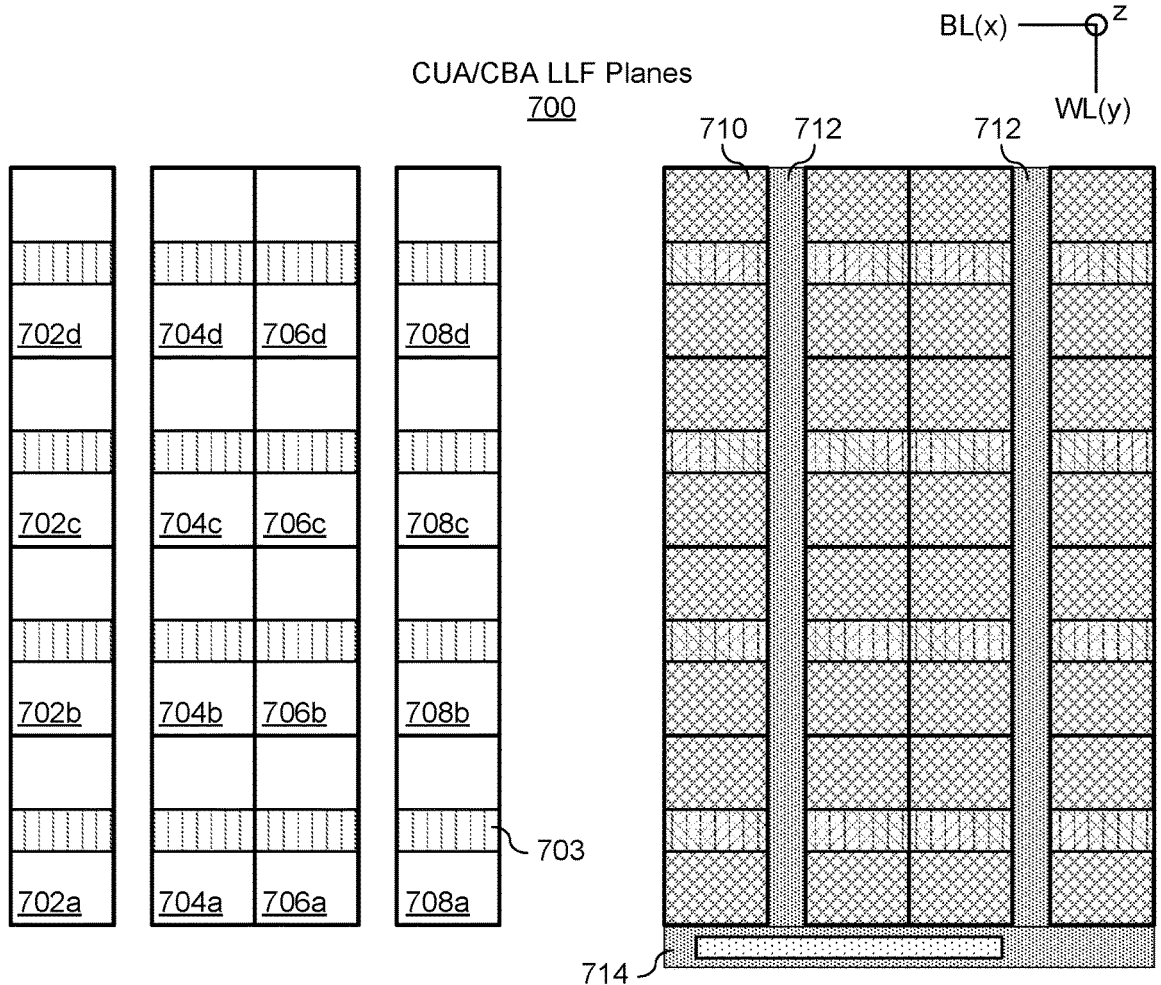
FIGS. 7A-7C depict different views of a multi-plane CUA or CBA storage medium 104 architecture implementing low latency flash (LLF) planes in accordance with some implementations.
Figure 7C:
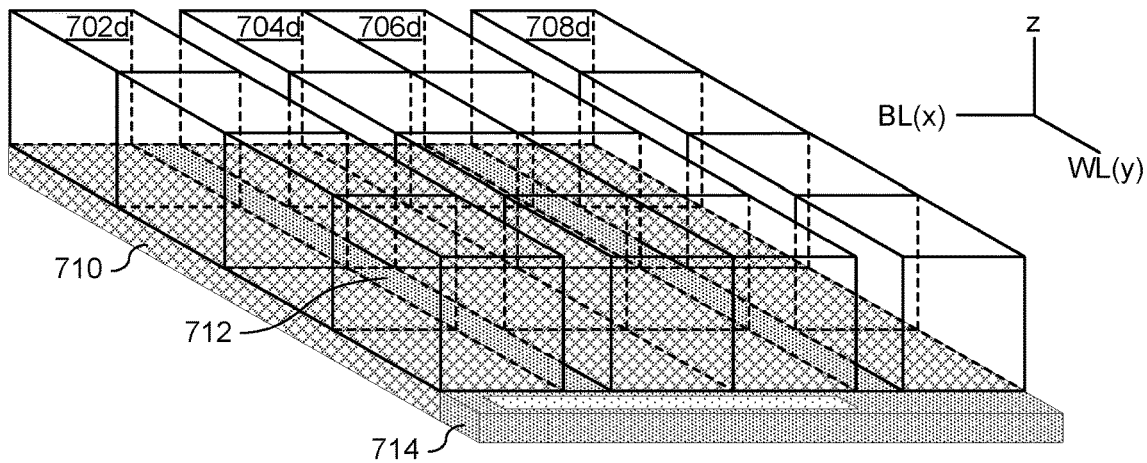

FIGS. 7A-7C depict different views of a multi-plane CUA or CBA storage medium 104 architecture implementing low latency flash (LLF) planes in accordance with some implementations. While the figures depict CUA architecture, the concepts described herein apply equally to CBA.

FIG. 7A depicts a top-down view of a multi-plane CUA structure 700 implementing a plurality of LLF planes in accordance with some implementations. Peripheral circuitry is not depicted in this figure, so as to highlight the layout of the planes. In some implementations, CUA structure 700 may correspond to at least a portion of storage medium 104 of storage system 100 (FIG. 3), and the physical implementation of word lines, bit lines, memory cells, and so forth, of each plane corresponds to the description above with reference to FIGS. 4A-4F.

CUA structure 700 includes a plurality of planes 702a-d, 704a-d, 706a-d, and 708a-d. In some implementations, each plane stores 4 KB of data. In other implementations, each plane may store more than 4 KB or less than 4 KB of data. Regardless of the implementation, however, the LLF planes in structure 700 store less data than the TLC/QLC planes in structure 600.

In the context of the top-down view, the word lines in each plane run vertically (in the y direction), and the bit lines run horizontally (in the x direction). The word lines in each plane are coupled to word line hookups (e.g., 703). The word line hookups are necessary for the internal connections of each word line layer to corresponding memory cells. In some implementations, the word lines in structure 700 have a length of approximately ¼th of the length of the word lines in structure 600 (where approximately denotes plus or minus 20 percent).

From the perspective of data storage, the word lines hookups constitute unusable overhead, since data cannot be stored in those areas. In some implementations, the total area of the word line hookups in a plane in structure 700 is equal to the total area of the word line hookups in a plane in structure 600. Since the planes in structure 700 are smaller, there is more hookup area in proportion to the total area of the plane, which translates to more wasted area from a data storage perspective. As such, the bit density in structure 700 is not as high as that in structure 600. As a result, structure 700 does not scale well with increased word line layers.

FIG. 7B depicts a top-down view of the multi-plane LLF structure 700 with peripheral circuitry in accordance with some implementations. The peripheral circuitry includes CUA components (under the planes) and CNA components (next to the planes).

The CUA components of the peripheral circuitry overlap (underneath) the planes of the memory array. Since the memory arrays in each plane in structure 700 are relatively small (compared to those in structure 600), the CUA components in structure 700 only include sense amplifier (SA) circuitry 710 (the peripheral control circuitry 712 does not fit underneath the arrays, and is therefore not included in CUA areas). The SA circuitry 710 corresponds to the sense blocks 370 in FIG. 3. SA circuitry 710 for a given plane is connected to that plane, in a one-to-one relationship. Stated another way, the SA circuitry for plane 702a is located underneath plane 702a, the SA circuitry for plane 702b is located underneath plane 702b, and so forth.

The CNA components of the peripheral circuitry are located adjacent and between the memory arrays. While the SA circuits may be placed under the arrays, the peripheral control circuitry 712 and other critical circuits 714 must be placed outside of (next to) the arrays. Such components include peripheral control circuitry 712, which corresponds to the control circuitry 310 in FIG. 3, and other peripheral circuitry 714, including components that must connect to other hardware components outside of the memory array. For example, bonding pads (including IO pads and power pads) are located in the CNA portion of the peripheral circuitry. The bonding pads may be located at one side of the chip to enable multi-die packaging.

FIG. 7C depicts a perspective view of the multi-plane LLF structure 700 with peripheral circuitry in accordance with some implementations. The word line hookups are not depicted in this figure, so as to highlight the relationship between the peripheral circuits and the planes of the memory array.

Since the arrays of the LLF structure 700 are so small (compared to those in structure 600), only the SA circuitry 710 can be placed under the arrays. As a result, additional peripheral circuitry 712 in the CNA regions between the arrays is necessary, which increases the data cost for the LLF structure 700. As such, the planes in LLF structure 700 may be oriented to optimize proximity to CNA regions while minimizing the overall surface area of the structure 700. One such layout is depicted in FIGS. 7A-7C, in which groups of four planes neighbor a CNA region 712, providing access to control circuitry for each plane.

Compared to TLC/QLC structure 600, LLF structure 700 has shorter word line length (e.g., 4 KB vs. 16 KB) and shorter bit line length (e.g., about half the number of blocks). As a result, LLF structure 700 has a lower read latency (e.g., 2-3 us), which can be 10 times faster than structure 600 in some implementations. The lower read latency achieved by the LLF structure 700 translates to higher performance. In some implementations, LLF structure 700 uses 1 bit-per-cell and 2-bit-per cell architectures, further tailoring LLF for high performance.

While LLF structure 700 can achieve higher performance when compared to TLC/QLC structure 600, LLF structure 700 is much more expensive than structure 600 and does not scale well. LLF structure 700 may cost 20 times more than TLC/QLC structure 600 in terms of per-GB prices, so it is better geared toward select applications such as datacenters and high-end workstations.

Further, LLF structure 700 does not scale well (with technology like CUA and CBA) due to its unique restrictions. Specifically, scaling the memory by increasing the number of word line layers typically reduces the cost of CUA/CBA structures since the arrays can pack more bits into the same area, with the necessary peripheral circuitry being able to fit underneath the array. However, for LLF, the effect of more word line layers is much less due to structural issues associated with the LLF structure, including the higher ratio of area occupied by overhead (e.g., word line hook-ups). Further, the smaller LLF plane size means less room for peripheral circuitry underneath the array, which means CUA and CBA technology does not bring much benefit to LLF chips.

Figure 8A:
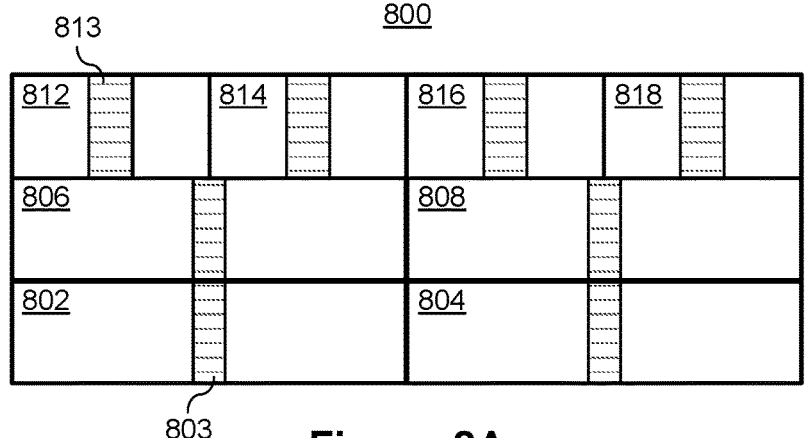
FIGS. 8A-8C depict different views of a hetero-plane storage medium 104 architecture implementing both TLC/QLC planes and LLF planes in accordance with some implementations.
Figure 8B:
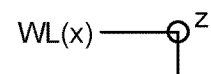
Figure 8B:
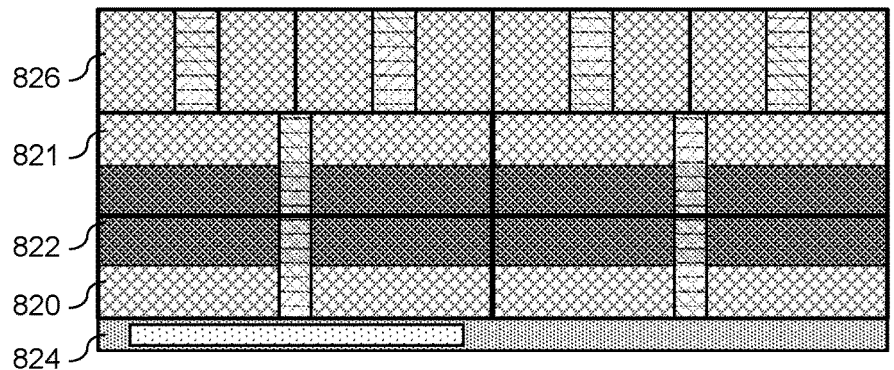
Figure 8C:
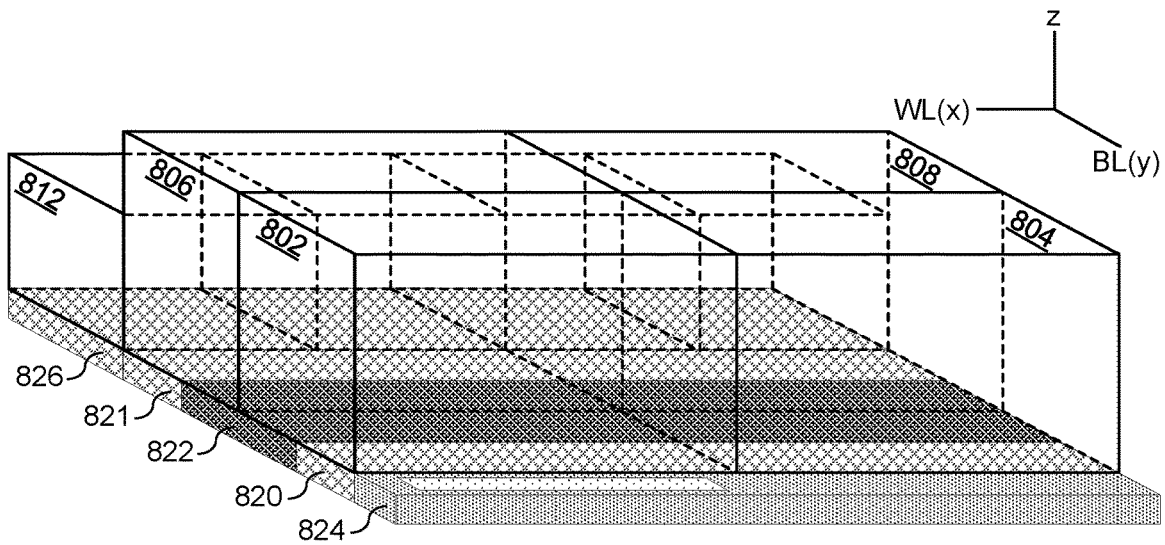

FIGS. 8A-8C depict different views of a hetero-plane storage medium 104 architecture implementing both TLC/QLC planes and LLF planes in accordance with some implementations. While the figures depict CUA architecture, the concepts described herein apply equally to CBA.

FIG. 8A depicts a top-down view of a hetero-plane structure 800 implementing a plurality of TLC/QLC planes (as described above with reference to structure 600, FIG. 6) and a plurality of LLF planes (as described above with reference to structure 700, FIG. 7) in accordance with some implementations. Peripheral circuitry is not depicted in this figure, so as to highlight the layout of the planes. In some implementations, hetero-plane structure 800 may correspond to at least a portion of storage medium 104 of storage system 100 (FIG. 3), and the physical implementation of word lines, bit lines, memory cells, and so forth, of each plane corresponds to the description above with reference to FIGS. 4A-4F.

Structure 800 includes a plurality of planes TLC/QLC planes 802, 804, 806, and 808 (corresponding to planes 602, 604, 606, and 608 in structure 600, FIG. 6), as well as a plurality of LLF planes 812, 814, 816, and 818 (corresponding to four of the LLF planes, e.g., 702a, 702b, 702c, and 702d in structure 700, FIG. 7). In some implementations, each TLC/QLC plane stores 16 KB of data, and each LLF plane stores 4 KB of data. In other implementations, each plane may store more than 16 KB/4 KB or less than 16 KB/4 KB of data. Regardless of the implementation, however, the LLF planes in structure 800 store less data than the TLC/QLC planes in structure 800.

In the context of the top-down view, the word lines in each plane (both TLC/QLC planes and LLF planes) run horizontally (in the x direction), and the bit lines in each plane (both TLC/QLC planes and LLF planes) run vertically (in the y direction). The word lines in each plane are coupled to word line hookups (e.g., 803, 813). The word line hookups are necessary for the internal connections of each word line layer to corresponding memory cells. In some implementations, the word lines in the LLF planes in structure 800 have a length of approximately ¼th of the length of the word lines in the TLC/QLC planes in structure 600 (where approximately denotes plus or minus 20 percent).

FIG. 8B depicts a top-down view of the hetero-plane structure 800 with peripheral circuitry in accordance with some implementations. The peripheral circuitry includes CUA components (under the planes) and CNA components (next to the planes).

The CUA components of the peripheral circuitry overlap (underneath) the plurality of planes of the memory array. The CUA components include sense amplifier (SA) circuitry 820, 821, and 826, and peripheral control circuitry 822. The SA circuitry 820, 821, and 826 corresponds to the sense blocks 370 in FIG. 3, and the peripheral control circuitry 822 corresponds to the control circuitry 310 in FIG. 3. SA circuitry 820 is connected to planes 802 and 804, SA circuitry 821 is connected to planes 806 and 808, and SA circuitry 826 is connected to planes 812, 814, 816, and 818. Peripheral control circuitry 822 is located between SA circuitry 820 and 821, and is connected to all four TLC/QLC planes 802, 804, 806, and 808, as well as all four LLF planes 812, 814, 816, and 818. The CUA regions (the area in which CUA circuitry is implemented) associated with planes 802, 804, 806, and 808 do not overlap the CUA regions associated with planes 812, 814, 816, and 818.

The CNA components of the peripheral circuitry are located adjacent to the memory array. While all SA circuits and almost all peripheral circuits may be placed under the array, some critical circuits must be placed outside of the array. Such components include peripheral control circuitry 824, including components that must connect to other hardware components outside of the memory array. For example, bonding pads (including IO pads and power pads) are located in the CNA portion of the peripheral circuitry. The bonding pads may be located at one side of the chip to enable multi-die packaging.

FIG. 8C depicts a perspective view of the hetero-plane structure 800 with peripheral circuitry in accordance with some implementations. The word line hookups are not depicted in this figure, so as to highlight the relationship between the peripheral circuits and the planes of the memory array.

As described above, hetero-plane structure 800 (also referred to as hetero-plane NAND) includes multiple types of planes inside one die. The TLC/QLC planes reduce the cost of scaling, while the LLF planes provide a performance benefit (as described above with reference to quicker read times). By placing the TLC/QLC planes and the LLF planes on the same die, the peripheral control circuitry for the LLF planes can be placed under the TLC/QLC planes (in CUA region 822, FIG. 8), rather than next to the planes (in CNA regions 712, FIG. 7). This saves valuable surface area on the die, which further contributes to cost reduction when scaling (when adding additional capacity in the form of additional word line layers).

Stated another way, planes in a first subset of one or more planes are configured like TLC/QLC planes, planes in a second subset of one or more planes are configured like LLF planes, and the peripheral control circuits for the planes in both the first and second subsets of planes are located underneath the first subset of one or more planes in a CUA configuration.

Stated yet another way, the control circuits of the LLF planes are placed under the TLC/QLC planes in a CUA arrangement, since the peripheral areas in the CUA regions of the LLF planes are more crowded due to presence of the SA circuitry 826 and the relatively low surface area of each plane. To provide additional area underneath the TLC/QLC planes to support control circuitry for the LLF planes, the TLC/QLC planes may be expanded and grown vertically (by adding additional word line layers), which provides more area in the CUA region (822) to fit the extra control circuitry for the LLF planes.

As a result of the CUA region 822 accommodating control circuitry for both TLC/QLC planes and LLF planes, no (or relatively little) CNA regions are required between the LLF planes and the rest of the die. As such, the LLF planes may be reoriented to optimize for surface area on the die. For example, the LLF planes in structure 700 are vertical with respect to the CNA peripheral region (714), but the LLF planes in structure 800 are horizontal with respect to the CNA peripheral region (824), which minimizes the footprint in the x-y directions.

While the hetero-plane structure 800 depicted in FIGS. 8A-8C includes a plurality of each type of plane (e.g., four TLC/QLC planes 802, 804, 806, and 808, and four LLF planes 812, 814, 816, and 818), some implementations may include only one of either type of plane, or only one of both types of planes. For example, in some implementations, structure 800 includes (i) only one TLC/QLC plane and a plurality of LLF planes, (ii) a plurality of TLC/QLC planes and only one LLF plane, or (iii) only one TLC/QLC plane and only one LLF plane. As such, hetero-plane structure 800 may be referred to as an architecture implementing a first subset of one or more planes having a TLC/QLC configuration and a second subset of one or more planes having an LLF configuration.

Figure 9:
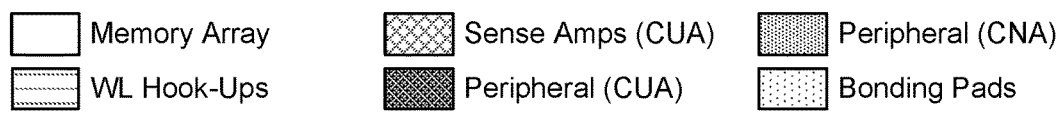
FIG. 9 depicts a first example hetero-plane layout in accordance with some implementations.
Figure 9:
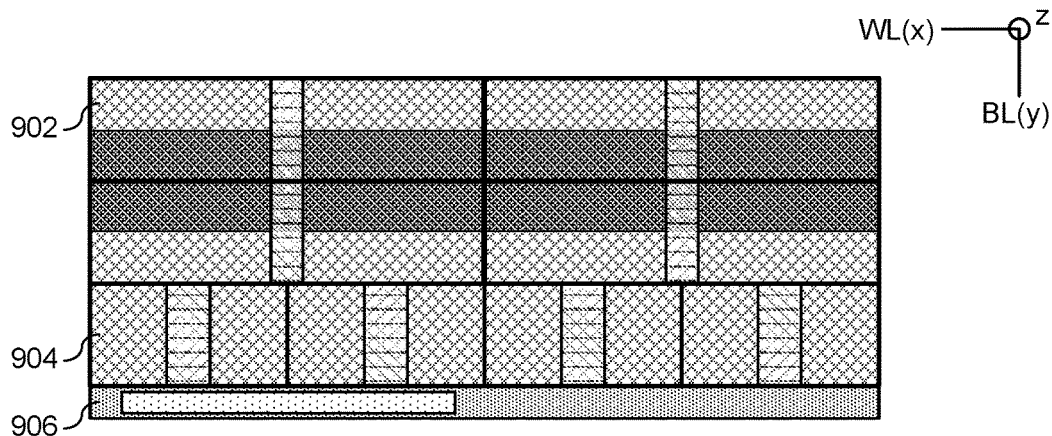
Figure 10:
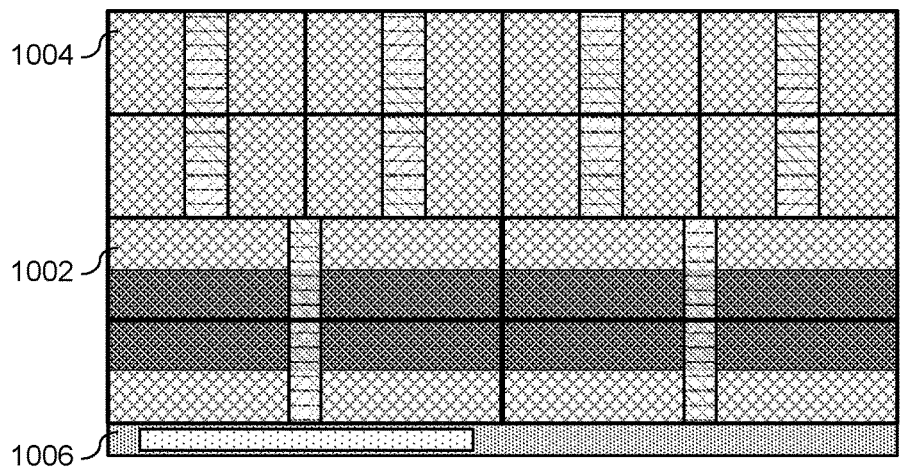
FIG. 10 depicts a second example hetero-plane layout in accordance with some implementations.
Figure 11:
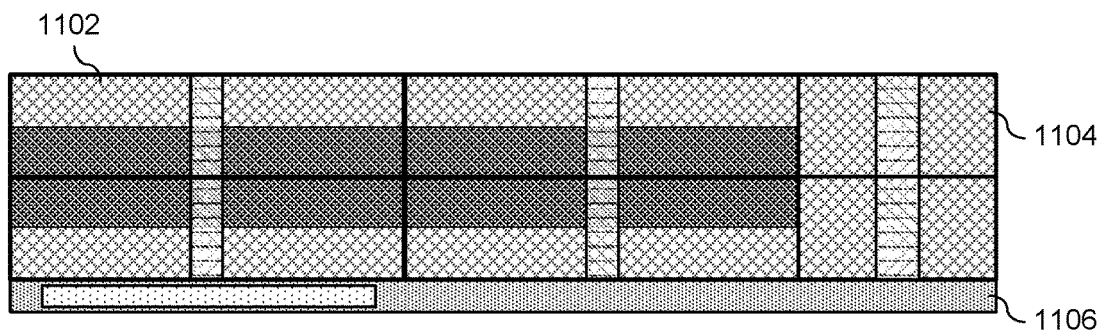
FIG. 11 depicts a third example hetero-plane layout in accordance with some implementations.

FIGS. 9-11 depict top-down views of alternative plane layouts for hetero-plane structures in accordance with some implementations. While structure 800 in FIG. 8 includes four TLC/QLC planes and four LLF planes, the concepts described here (e.g., shared CUA space for control circuitry and different types of planes included on the same die) apply to other layouts.

FIG. 9 depicts an example hetero-plane layout in which the LLF planes 904 are located between the TLC/QLC planes 902 and the CNA peripheral circuitry 906. FIG. 10 depicts an example hetero-plane layout in which there are eight LLF planes 1004, in addition to the four TLC/MLC planes 1002 and CNA peripheral circuitry 1006 as described above. FIG. 11 depicts an example hetero-plane layout in which the LLF planes 1104 are located to the side of the TLC/QLC planes 1102, so that the TLC/QLC planes 1102 and the LLF planes 1104 are relatively close to the CNA peripheral circuitry 1106.

In each of the architectures described in FIGS. 9-11, the CUA peripheral circuitry of the TLC/QLC planes includes control circuitry for not only the subset of TLC/QLC planes, but also the subset of LLF planes. Further, the architectures depicted in FIGS. 9-11 are illustrative in nature, and are not meant to be limiting. Other layouts may be implemented, as long as the CUA peripheral circuitry of a subset of one or more TLC/QLC planes includes control circuitry for not only the subset of one or more TLC/QLC planes, but also the subset of one or more LLF planes.

Figure 12:
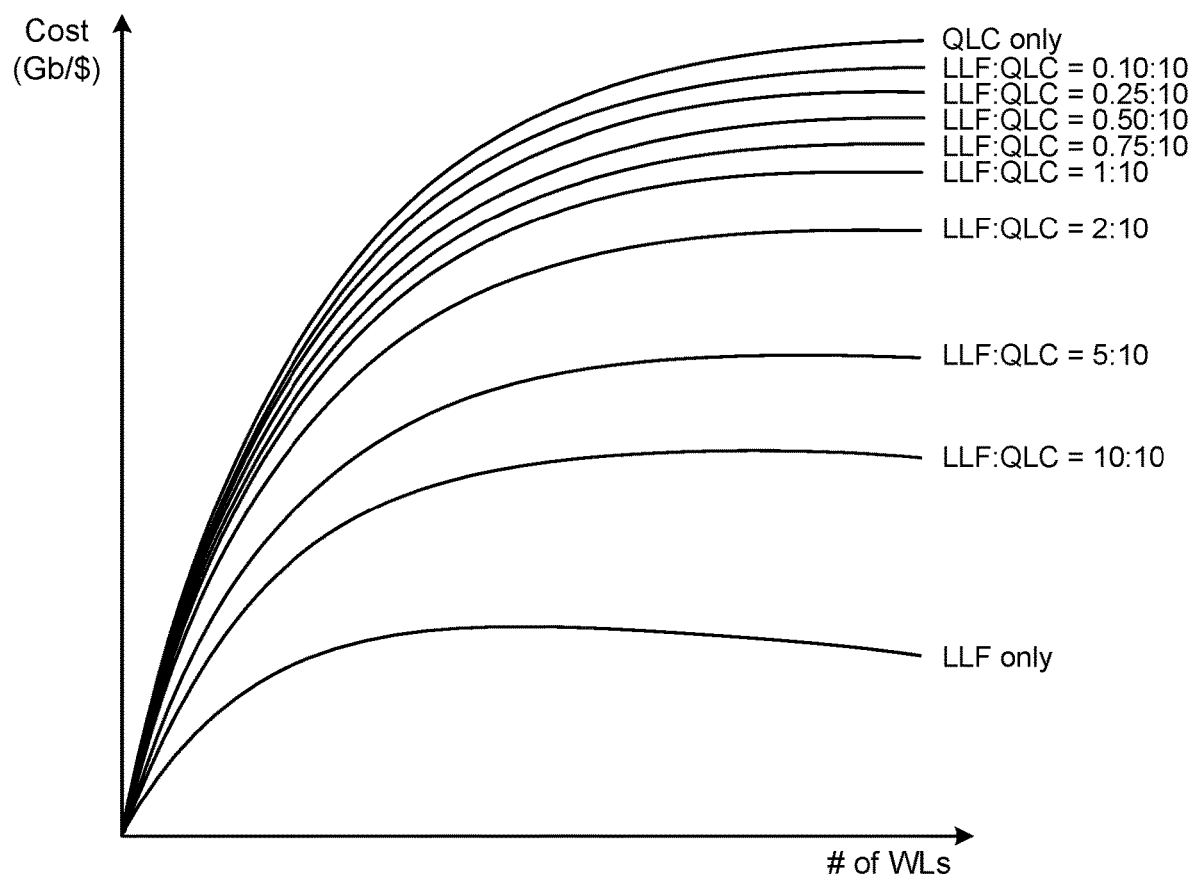
FIG. 12 is a graph depicting an example scaling costs of successive (present and future) generations of storage mediums implementing different mixtures of LLF and TLC/QLC planes in accordance with some implementations.

FIG. 12 is a graph depicting an example scaling costs of successive (present and future) generations of storage mediums implementing different mixtures of LLF and TLC/QLC (referred to in the graph as QLC for brevity) planes in accordance with some implementations. The vertical axis is the cost of a unit of data (e.g., a Gb) for the same amount of money (e.g., per dollar). The higher the number, the better the scaling (due to increased storage capacity becoming cheaper on a per dollar basis). The horizontal axis is the number of word lines. As storage systems continue to scale, the number of word lines in the memory arrays continue to grow (in the z direction, see FIGS. 4A and 4C).

Treating the ratio of LLF capacity to TLC/QLC capacity as a variable (e.g., a 0.1:10 ratio would provide for 10 GB of LLF capacity to 1 TB of QLC capacity), a storage medium may be optimized by balancing scaling properties (by providing more TLC/QLC capacity) with high performance (by providing more LLF capacity).

Notably, almost the same scaling cost as pure QLC can be achieved by adding a relatively small proportion of LLF planes (e.g., 1 Gb). But even a relatively small proportion of LLF planes can provide very fast read latency for those planes, which can improve the overall performance of the storage system 100.

Also of note, a storage medium with only LLF planes does not scale well (the amount of storage capacity per unit of cost does not increase over time). Adding TLC/QLC planes to the storage medium provides for better scaling, while still taking advantage of the high performance provided by the LLF planes.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention, different components as opposed to those specifically mentioned may perform at least some of the features described herein, and features of the disclosed embodiments may be combined. As used herein, the terms "about" and "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A flash memory die of a data storage system, the flash memory die comprising:
   a first subset of one or more planes, wherein each plane of the first subset includes a plurality of blocks of flash memory cells connected to (i) a first number of word line layers and (ii) a plurality of bit lines having a first length;
   a second subset of one or more planes, wherein each plane of the second subset includes a plurality of blocks of flash memory cells connected to (ii) a second number of word line layers less than the first number of word line layers and (ii) a plurality of bit lines having a second length shorter than the first length;
   first peripheral circuitry implemented underneath the first subset of planes and including:
      first sense amplifier circuitry connected to the first subset of planes,
      first peripheral control circuitry connected to the first subset of planes; and
      second peripheral control circuitry connected to the second subset of planes; and
   second peripheral circuitry implemented underneath the second subset of planes and including second sense amplifier circuitry connected to the second subset of planes.

2. The flash memory die of claim 1, wherein:
the first peripheral circuitry is arranged in a complementary metal-oxide-semiconductor (CMOS) under array (CUA) architecture under the plurality of blocks of flash memory cells of the first subset of planes; and
the second peripheral circuitry is arranged in a CUA architecture under the plurality of blocks of flash memory cells of the second subset of planes.

3. The flash memory die of claim 1, wherein:
the first subset of planes includes four planes arranged in two rows of two planes each; and
the second subset of planes includes four planes arranged in one row.

4. The flash memory die of claim 1, further comprising:
third peripheral circuitry located adjacent to the first subset of planes or the second subset of planes and including bonding pads configured to connect to an interface channel between the flash memory die and a storage controller of the data storage system.

5. The flash memory die of claim 4, wherein the third peripheral circuitry is arranged in a CMOS next to array (CNA) architecture adjacent to the plurality of blocks of flash memory cells of the first or second subset of planes.

6. The flash memory die of claim 4, wherein the first subset of planes is located between the second subset of planes and the third peripheral circuitry.

7. The flash memory die of claim 4, wherein the second subset of planes is located between the first subset of planes and the third peripheral circuitry.

8. The flash memory die of claim 1, wherein:
each of the first subset of planes includes a first number of blocks of flash memory cells; and
each of the second subset of planes includes a second number of blocks of flash memory cells less than the first number of blocks of flash memory cells.

9. The flash memory die of claim 1, wherein:
each of the first subset of planes has a first vertical height extending away from the first peripheral circuitry; and
each of the second subset of planes has a second vertical height shorter than the first vertical height extending away from the second peripheral circuitry.

10. The flash memory die of claim 1, wherein:
each of the first subset of planes is optimized for cost scalability; and
each of the second subset of planes is optimized for read performance.

11. The flash memory die of claim 1, wherein:
each of the first subset of planes includes at least 96 word line layers; and
each of the second subset of planes is associated with a read latency of 3 microseconds or less.

12. The flash memory die of claim 1, wherein:
the flash memory cells in each of the first subset of planes are configured to store at least three bits of data per cell; and
the flash memory cells in each of the second subset of planes are configured to store one or two bits of data per cell.

13. The flash memory die of claim 1, wherein the first peripheral control circuitry and the second peripheral control circuitry include voltage regulators, charge pumps, page buffers, timing circuits, and level shifters.

14. The flash memory die of claim 1, wherein the first subset of planes, the second subset of planes, the first peripheral circuitry, and the second peripheral circuitry are implemented in a single wafer.

15. The flash memory die of claim 1, wherein:
the first subset of planes and the second subset of planes are implemented in a first wafer;
the first peripheral circuitry and the second peripheral circuitry are implemented in a second wafer; and
the first wafer and the second wafer are bonded together.

16. A flash memory die of a data storage system, the flash memory die comprising:
one or more triple-level-cell (TLC) or quad-level-cell (QLC) planes, wherein each of the one or more TLC or QLC planes includes a first plurality of blocks of flash memory cells;
one or more low latency flash (LLF) planes, wherein each of the one or more LLF planes includes a second plurality of blocks, fewer than the first plurality of blocks, of flash memory cells;
a first complementary metal-oxide-semiconductor (CMOS) under array (CUA) region of peripheral circuitry located underneath the one or more TLC or QLC planes;
a second CUA region of peripheral circuitry located underneath the one or more LLF planes;
first sense amplifier circuitry connected to the one or more TLC or QLC planes and implemented in the first CUA region;
first peripheral control circuitry connected to the one or more TLC or QLC planes and implemented in the first CUA region;
second sense amplifier circuitry connected to the one or more LLF planes and implemented in the second CUA region; and
second peripheral control circuitry connected to the one or more LLF planes and implemented in the first CUA region and not in the second CUA region.

17. The flash memory die of claim 16, wherein the first CUA region and the second CUA region do not overlap.

18. The flash memory die of claim 16, at least two TLC or QLC planes of the one or more TLC or QLC planes are adjacent to at least two LLF planes of the one or more LLF planes with no CMOS next to array (CNA) peripheral circuitry between the at least two TLC or QLC planes and the at least two LLF planes.

19. The flash memory die of claim 16, further comprising a CNA region of peripheral circuitry adjacent to the first CUA region or the second CUA region and including bonding pads configured to connect to an interface channel between the flash memory die and a storage controller of the data storage system.

20. A flash memory die of a data storage system, the flash memory die comprising:
means for storing data in a first subset of one or more planes, wherein each plane of the first subset includes a plurality of blocks of flash memory cells connected to (i) a first number of word line layers and (ii) a plurality of bit lines having a first length;
means for storing data in a second subset of one or more planes, wherein each plane of the second subset includes a plurality of blocks of flash memory cells connected to (ii) a second number of word line layers less than the first number of word line layers and (ii) a plurality of bit lines having a second length shorter than the first length;
means for processing stored data in first peripheral circuitry implemented underneath the first subset of planes and including:

first sensing means connected to the first subset of planes, first control means connected to the first subset of planes; and second control means connected to the second subset of planes; and means for processing stored data in second peripheral circuitry implemented underneath the second subset of planes and including second sensing means connected to the second subset of planes.

* * * * *